(12) United States Patent
Teranishi et al.

(10) Patent No.: US 11,217,739 B2
(45) Date of Patent: Jan. 4, 2022

(54) SEMICONDUCTOR SUBSTRATE AND METHOD FOR PRODUCING SAME, SUBSTRATE, AND LAMINATE

(71) Applicant: KYUSHU UNIVERSITY, NATIONAL UNIVERSITY CORPORATION, Fukuoka (JP)

(72) Inventors: Ryo Teranishi, Fukuoka (JP); Shinji Munetoh, Fukuoka (JP); Osamu Furukimi, Fukuoka (JP)

(73) Assignee: KYUSHU UNIVERSITY, NATIONAL UNIVERSITY CORPORATION, Fukuoka (JP)

( * ) Notice: Subject to any disclaimer, the term of this patent is extended or adjusted under 35 U.S.C. 154(b) by 0 days.

(21) Appl. No.: 16/619,447

(22) PCT Filed: Jun. 7, 2018

(86) PCT No.: PCT/JP2018/021877
§ 371 (c)(1),
(2) Date: Dec. 4, 2019

(87) PCT Pub. No.: WO2018/225823
PCT Pub. Date: Dec. 13, 2018

(65) Prior Publication Data
US 2020/0161524 A1    May 21, 2020

(30) Foreign Application Priority Data

Jun. 9, 2017 (JP) .............................. JP2017-114352

(51) Int. Cl.
*H01L 35/14* (2006.01)
*H01L 35/20* (2006.01)
(Continued)

(52) U.S. Cl.
CPC .............. *H01L 35/22* (2013.01); *H01L 35/34* (2013.01)

(58) Field of Classification Search
CPC ................................. H01L 35/22; H01L 35/26
See application file for complete search history.

(56) References Cited

U.S. PATENT DOCUMENTS

2008/0216884 A1    9/2008 Shibata et al.

FOREIGN PATENT DOCUMENTS

| JP | 2005-217310 A | 8/2005 |
|---|---|---|
| JP | 2006-057124 A | 3/2006 |

(Continued)

OTHER PUBLICATIONS

Yamasoto et al., "A Novel Electric Power Generation Mechanism from Waste Heat without Temperature Gradient," MRS Advances, p. 3941 (Year: 2016).*

(Continued)

*Primary Examiner* — Angelo Trivisonno
(74) *Attorney, Agent, or Firm* — Studebaker & Brackett PC

(57) ABSTRACT

A semiconductor substrate contains a clathrate compound of the following General Formula (I). The semiconductor substrate includes a variable-composition layer which includes a pn junction and where composition of the clathrate compound varies along a thickness direction. A rate of change in y in the thickness direction of at least a portion of the variable-composition layer is $1\times10^{-4}/\mu m$ or more.

$$A_xB_yC_{46-y} \qquad (I)$$

In General Formula (I), A represents at least one element selected from the group consisting of Ba, Na, Sr, and K, B represents at least one element selected from the group consisting of Au, Ag, Cu, Ni, and Al, and C represents at (Continued)

least one element selected from the group consisting of Si, Ge, and Sn, x is 7 to 9, and y is 3.5 to 6 or 11 to 17.

11 Claims, 25 Drawing Sheets

(51) Int. Cl.
*H01L 35/22* (2006.01)
*H01L 35/34* (2006.01)

(56) References Cited

FOREIGN PATENT DOCUMENTS

| JP | 2017-144362 A | 8/2017 |
| WO | 2014/050100 A1 | 4/2014 |
| WO | 2015/125823 A1 | 8/2015 |

OTHER PUBLICATIONS

Keita Yamasoto et al, "A Novel Electric Power Generation Mechanism from Waste Heat without Temperature Gradient", MRS Advances, Jan. 1, 2016, pp. 3941-3946, XP055638932, DOI: 10.1557/adv.2016.292.

The extended European search report issued by the European Patent Office dated Feb. 11, 2021, which corresponds to European Patent Application No. 18812951.4-1211 and is related to U.S. Appl. No. 16/619,447.

International Search Report issued in PCT/JP2018/021877; dated Aug. 14, 2018.

International Preliminary Report on Patentability and Written Opinion issued in PCT/JP2018/021877; dated Dec. 10, 2019.

Shinji Munetoh et al.; "A Novel Electric Power Generation under Uniform Temperature Environment using Poly-crystalline Ba8AuxSi46-x Clathrate"; Journal of the Japan Society of Powder and Powder Metallurgy; Aug. 15, 2017; pp. 471-474; vol. 64, No. 8.

* cited by examiner (A)

(B)

(B)

(C)

(A)

(B)

(C)

(A)

(B)

(C)

SEMICONDUCTOR SUBSTRATE AND METHOD FOR PRODUCING SAME, SUBSTRATE, AND LAMINATE

TECHNICAL FIELD

The present disclosure relates to a semiconductor substrate, a method for producing the same, a substrate, and a laminate.

BACKGROUND ART

In an internal combustion engine of an automobile, an aircraft, or the like, energy obtained by combustion of fossil fuels is utilized. At present, energy efficiency of the internal combustion engine is only about 30%, and most of the energy is released as heat energy. In order to effectively utilize the heat energy, various thermoelectric materials utilizing the Seebeck effect have been studied.

As the thermoelectric materials, various semiconductor materials have been examined. For example, Patent Literature 1 has proposed a thermoelectric element which is a sintered body of Si clathrate compound (inclusion compound). Then, as one of indexes for evaluating performance of the thermoelectric element, a ZT value which is a dimensionless performance index is presented. In order to improve the ZT value, various techniques have been studied.

The clathrate compound is configured with an eight-cage network including Group 14 elements such as Si and Group 1 or Group 2 atoms (guest atoms) which are included one by one in the cage. Since phonons are scattered by the vibration of the guest atoms at a low frequency, the clathrate compound has a sufficiently low thermal conductivity. Having such a low thermal conductivity contributes to the improvement of the ZT value.

Although various techniques for improving the ZT value of the thermoelectric material have been examined, there is still room for improvement of thermoelectric conversion efficiency. In addition, the thermoelectric material is intended to generate power by using a difference in electromotive force based on temperature difference, but in the case of assembling a power generation module using the thermoelectric material, the temperature difference is reduced due to thermal conduction, so that there is a concern that the power generation amount is decreased.

Therefore, Patent Literature 2 has proposed a semiconductor single crystal including an n-type semiconductor portion, a p-type semiconductor portion, and an intrinsic semiconductor portion therebetween, and the intrinsic semiconductor portion has a smaller band gap than the n-type semiconductor portion and the p-type semiconductor portion. According to the semiconductor single crystal of Patent Literature 2, power can be generated in a predetermined temperature range even without the temperature difference between the n-type semiconductor portion and the p-type semiconductor portion.

CITATION LIST

Patent Literature

Patent Literature 1: Japanese Unexamined Patent Publication No. 2006-57124
Patent Literature 2: International Publication No. WO 2015/125823

SUMMARY OF INVENTION

Technical Problem

The semiconductor single crystal of Patent Literature 2 or the like is considered to be useful as a power generation material. When a technique of easily producing a thinned material without compromising such performance is established, the usability is further improved, and it is expected that the technique is to be widely deployed in technology industries. Therefore, in one aspect, an object of the present disclosure is to provide a semiconductor substrate capable of efficiently generating power even when the semiconductor substrate is thinned. In addition, in another aspect, an object of the present disclosure is to provide a producing method capable of easily producing a semiconductor substrate useful as a power generation material. Furthermore, in another aspect, an object of the present disclosure is to provide a substrate useful for producing the above-described semiconductor substrate and a laminate obtained by laminating the above-described semiconductor substrate.

Solution to Problem

The semiconductor substrate according to at least one embodiment of the present invention is a semiconductor substrate containing a clathrate compound of the following General Formula (I), including a variable-composition layer where composition varies along a thickness direction and which includes a pn junction, in which, when the composition is converted in terms of a composition ratio of the clathrate compound, a rate of change in y in the thickness direction of a portion of the variable-composition layer including the pn junction is $1\times10^{-4}/\mu m$ or more.

$$A_xB_yC_{46-y} \quad (I)$$

In the above General Formula (I), A represents at least one element selected from the group consisting of Ba, Na, Sr, and K, B represents at least one element selected from the group consisting of Au, Ag, Cu, Ni, and Al, and C represents at least one element selected from the group consisting of Si, Ge, and Sn. x is 7 to 9, and y is 3.5 to 6 or 11 to 17.

The semiconductor substrate containing the clathrate compound of the above General Formula (I) can control the band gap by varying the composition thereof along the thickness direction. For this reason, it is possible to generate an electromotive force even without a temperature difference along the thickness direction. Since the rate of change in y is high in the thickness direction, the semiconductor substrate can efficiently generate power even when the semiconductor substrate is thinned. However, applications of the semiconductor substrate are not limited to the power generation material, but it is also possible to use the semiconductor substrate for various applications in accordance with characteristics thereof.

The semiconductor substrate further includes an n-type semiconductor portion and a p-type semiconductor portion which is larger in y/x than the n-type semiconductor portion so as to interpose the pn junction, and the thickness may be 5 mm or less. Therefore, by further increasing the rate of change in y while promoting thinning, it is possible to obtain a larger electromotive force.

In the semiconductor substrate, a maximum value of a difference between y in the p-type semiconductor portion and y in the n-type semiconductor portion may be 1 or more. By increasing the maximum value of the difference in y, it is possible to simultaneously achieve the decrease of the thickness and the increase of the electromotive force at higher levels.

The clathrate compound may be represented by the following General Formula (II).

$$Ba_xAu_ySi_{46-y} \quad (II)$$

In the above General Formula (II), x is 7 to 9, and y is 3.5 to 6.

A method for producing a semiconductor substrate according to at least one embodiment of the present invention includes a step of forming a pn junction by heating a substrate including an n-type semiconductor base containing a clathrate compound having a composition of the following General Formula (I) and a coating layer where a molar concentration of an element B in General Formula (I) is higher than that of the n-type semiconductor base on a surface of the n-type semiconductor base to diffuse the element B into an interior of the n-type semiconductor base.

$$A_xB_yC_{46-y} \quad (I)$$

In the above General Formula (I), A represents at least one element selected from the group consisting of Ba, Na, Sr, and K, B represents at least one element selected from the group consisting of Au, Ag, Cu, Ni, and Al, and C represents at least one element selected from the group consisting of Si, Ge, and Sn. x is 7 to 9, and y is 3.5 to 6 or 11 to 17.

According to the producing method, it is possible to easily produce a semiconductor substrate useful as a power generation material. Since it is possible to produce semiconductor substrates having various shapes in accordance with the shapes and sizes of the substrates, it is possible to easily produce a thin semiconductor substrate.

In the above-described producing method, in the step, the substrate including the n-type semiconductor base and the coating layer on the surface thereof is preferably heated to 300 to 1000° C. By heating in such a temperature range, diffusion of the element B is promoted, so that it is possible to produce a semiconductor substrate capable of generating a large electromotive force.

The semiconductor substrate includes a variable-composition layer where composition varies along a thickness direction and which includes the pn junction, and when the composition is converted in terms of a composition ratio of the clathrate compound, a rate of change in y in the thickness direction of a portion of the variable-composition layer including the pn junction may be $1 \times 10^{-4}$/μm or more. Since the semiconductor substrate includes the portion having a high rate of change in y in the thickness direction, the semiconductor substrate can efficiently generate power even when the semiconductor substrate is thinned.

The clathrate compound may be represented by the following General Formula (II).

$$Ba_xAu_ySi_{46-y} \quad (II)$$

In the above General Formula (I), x is 7 to 9, and y is 3.5 to 6.

A laminate according to at least one embodiment of the present invention includes a laminated portion where a plurality of the semiconductor substrates are laminated so the semiconductor substrates are adjacent to each other in the thickness direction and so that increasing and decreasing directions of y are the same. Since the laminate can generate a sufficiently large electromotive force, the laminate is extremely useful as a power generation material. However, applications of the laminate are not limited thereto, but it is also possible to use the laminate for other applications in accordance with characteristics thereof.

A substrate according to at least one embodiment of the present invention includes an n-type semiconductor base containing a clathrate compound having a composition of the above General Formula (I) and a coating layer where a molar concentration of an element B in the above General Formula (I) is higher than that of the n-type semiconductor base on a surface of the n-type semiconductor base. The substrate is useful for producing the above-described semiconductor substrate capable of efficiently generating power. However, applications of the substrate are not limited thereto. The clathrate compound may be one represented by the above General Formula (II).

Advantageous Effects of Invention

According to the present disclosure, in one aspect, it is possible to provide a semiconductor substrate capable of efficiently generating power even when the semiconductor substrate is thinned. In addition, in another aspect, it is possible to provide a producing method capable of easily producing a semiconductor substrate useful as a power generation material. Furthermore, in another aspect, it is possible to provide a substrate useful for producing the above-described semiconductor substrate and a laminate obtained by laminating the above-described semiconductor substrate.

BRIEF DESCRIPTION OF DRAWINGS

FIG. 18(A) is a photograph of the substrate before heating, and FIG. 18(B) is a photograph obtained after heating the substrate to 300° C. FIG. 18(C) is a photograph of the semiconductor substrate obtained by heating the substrate to 400° C.

FIG. 19(A) is a photograph of the semiconductor substrate obtained by heating the substrate to 500° C., and FIG. 19(B) is a photograph of the semiconductor substrate obtained by heating the substrate to 600° C. FIG. 19(C) is a photograph of the semiconductor substrate obtained by heating the substrate to 700° C.

FIG. 20(A) is a photograph of the semiconductor substrate (Example 2) obtained by heating the substrate to 800° C., and FIG. 20(B) is a photograph of the semiconductor substrate (Example 1) obtained by heating the substrate to 900° C. FIG. 20(C) is a photograph of the semiconductor substrate obtained by heating the substrate to 950° C.

DESCRIPTION OF EMBODIMENTS

Figure 1:
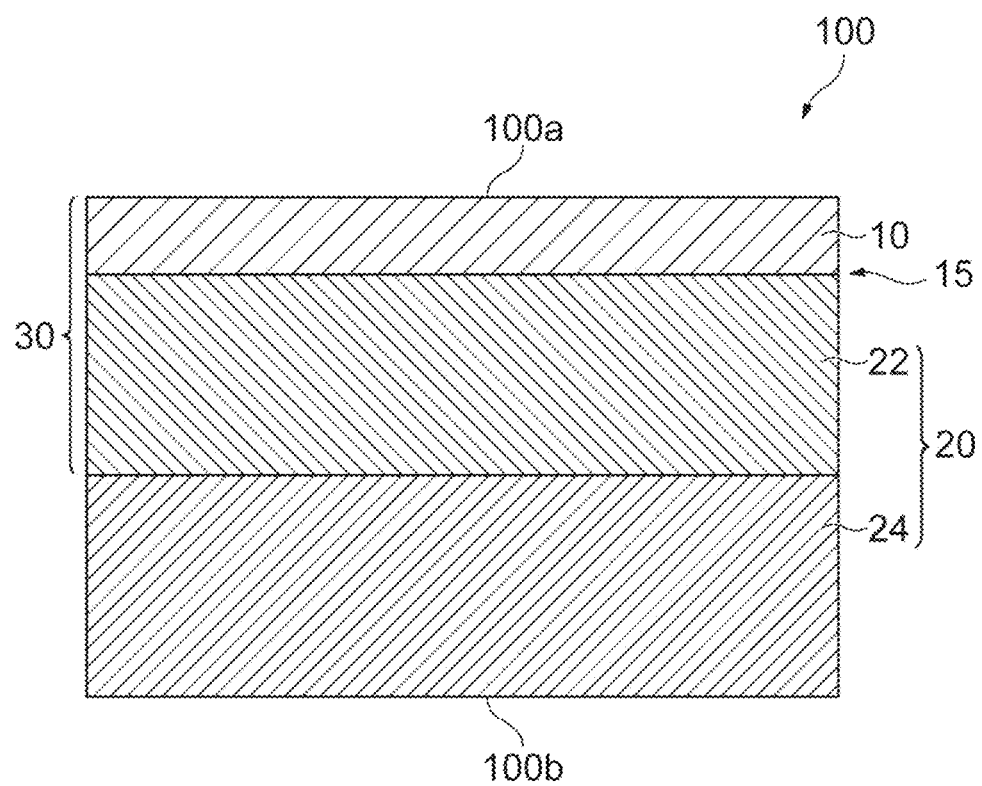
FIG. 1 is a cross-sectional view schematically illustrating a semiconductor substrate according to an embodiment.

Hereinafter, several embodiments of the present invention will be described in detail with reference to the drawings in some cases. However, the present invention is not limited to the following embodiments. In addition, the same or equivalent elements in the drawings are denoted by the same reference numerals, and redundant description is omitted in some cases. In addition, vertical and horizontal positional relationships are based on positional relationships illustrated in the drawings unless otherwise specified. Furthermore, dimensional ratios of elements are not limited to illustrated ratios.

FIG. 1 is a view schematically illustrating a cross section taken along the thickness direction of a semiconductor substrate according to the present embodiment. A semiconductor substrate 100 has, for example, a flat plate shape and includes a p-type semiconductor portion 10 and an n-type semiconductor portion 20 in this order from the upper side along a thickness direction (vertical direction in FIG. 1). That is, the thickness direction of the semiconductor substrate coincides with the facing direction of the p-type semiconductor portion 10 and the n-type semiconductor portion 20. The semiconductor substrate 100 includes a pn junction 15 between the p-type semiconductor portion 10 and the n-type semiconductor portion 20. The pn junction 15 may be an intrinsic semiconductor.

The semiconductor substrate 100 may have a substrate-like shape (semiconductor substrate) and may have, for example, a film-like shape (semiconductor film) of which thickness is reduced. The thickness of the semiconductor substrate 100 is preferably 5 mm or less, more preferably 3 mm or less, furthermore preferably 2 mm or less. By thinning the semiconductor substrate 100, it is possible to reduce the sizes of the various devices where the semiconductor substrate 100 is mounted. Therefore, it is possible to further expand applications of the semiconductor substrate.

The p-type semiconductor portion 10 and the n-type semiconductor portion 20 of the semiconductor substrate 100 include a clathrate compound represented by General Formula (I). The clathrate compound contains A, B, and C as constituent elements.

$$A_x B_y C_{46-y} \qquad (I)$$

In General Formula (I), A represents at least one element selected from the group consisting of Ba, Na, Sr, and K, B represents at least one element selected from the group consisting of Au, Ag, Cu, Ni, and Al, and C represents at least one element selected from the group consisting of Si, Ge, and Sn. x is 7 to 9, and y is 3.5 to 6 or 11 to 17.

In the clathrate compound of General Formula (I), the element A functions as a monovalent or divalent donor, and the element B functions as a trivalent or monovalent acceptor. The composition of the clathrate compound in a variable-composition layer 30 varies along the thickness direction of the semiconductor substrate 100. The variable-composition layer 30 includes the p-type semiconductor portion 10, the pn junction 15, and a diffusion layer 22 of the n-type semiconductor portion 20. The thickness of the variable-composition layer 30 may be, for example, 0.1 to 100 μm and may be 0.5 to 50 μm.

The rate of change in y in the thickness direction of the portion including the pn junction 15 of the variable-composition layer 30 is $1\times10^{-4}$/μm or more. In this manner, the variable-composition layer 30 includes the portion having a high rate of change in y, and thus, even when the thickness of the semiconductor substrate 100 is reduced, a sufficiently large electromotive force can be obtained, so that it is possible to efficiently generate power. From the viewpoint of obtaining a larger electromotive force, the above-described rate of change in y is preferably $1\times10^{-3}$/μm or more, more preferably $1\times10^{-2}$/μm or more, furthermore preferably 0.1/μm or more. There is no particular upper limit in the rate of change in y, but from the viewpoint of ease of production, the upper limit is, for example, 10/μm.

The rate of change in y is obtained in the following manner. In the cross section of the variable-composition layer 30 along the thickness direction, two points of which the distances from a principal surface 100a of the semiconductor substrate 100 are different from each other are selected. At this time, the two points are selected so as to interpose the pn junction 15 that extends to be perpendicular to the thickness direction. The compositions are measured at two points, and the compositions are converted in terms of the composition ratios to the clathrate compound of General Formula (I). The absolute value of the difference in y between two points which is obtained in conversion is divided by the distance between the two points. In this manner, it is possible to determine the rate of change in y. From the viewpoint of suppressing a variation in value, the distance between the two points is preferably 2 to 10 μm.

From the viewpoint of thickness reduction by reducing the thickness of the semiconductor substrate 100, the distance L (thickness) required to change y by 1 is for example, 100 μm or less, preferably 20 μm or less, more preferably 10 μm or less, furthermore preferably 5 μm or less.

In the semiconductor substrate 100, the magnitude relationship of y indicating the molar ratio of the element B in the clathrate compound of the above General Formula (I) may satisfy the following Formula (1). In this manner, since a concentration gradient of the element B along the thickness direction of the semiconductor substrate 100 is provided, it is possible to improve power generation materials.

p-type semiconductor portion 10>pn junction 15>n-type semiconductor portion 20     (1)

x representing the molar ratio of the element A may be a substantially uniform throughout the semiconductor substrate 100, and the magnitude relationship of x may satisfy the following Formula (2).

p-type semiconductor portion 10<pn junction 15<n-type semiconductor portion 20     (2)

x of the clathrate compound contained in the p-type semiconductor portion 10 is, for example, 7 to 9, and y is for example, 5 to 5.3 or 16 to 17. x of the clathrate compound contained in the n-type semiconductor portion 20 is, for example, 7 to 9, and y is for example, 3.5 to 5.3 or 11 to 16. x of the clathrate compound in the pn junction 15 is 7 to 9, and y is about 5.3 or about 16.

The magnitude relationship between the molar ratios (y/x) of the element B to the element A tends to satisfy the above Formula (1). In the diffusion layer 22 of the n-type semiconductor portion 20, y and y/x tend to be increased as it is closer to the pn junction 15. On the other hand, in a base layer 24 of the n-type semiconductor portion 20, the composition along the thickness direction of the semiconductor substrate 100 is not changed. In addition, the n-type semiconductor portion 20 does not necessarily have the base layer 24, and the n-type semiconductor portion 20 may not have the base layer 24.

A maximum value of the difference between y in the p-type semiconductor portion 10 and y in the n-type semiconductor portion 20 is preferably 1 or more, more preferably 1.1 or more, furthermore preferably 1.2 or more. In this manner, by increasing the maximum value of the difference in y, it is possible to simultaneously achieve the decrease of the thickness and the increase of the electromotive force at higher levels. The maximum value of the difference in y may be obtained, for example, as a difference between y obtained by converting the composition of the principal surface 100a of the p-type semiconductor portion 10 side of the semiconductor substrate 100 in terms of the composition ratio of the clathrate compound and y obtained by converting the composition of a principal surface 100b of the n-type semiconductor portion 20 side in terms of the composition ratio of the clathrate compound. The difference in y obtained in this manner is preferably 1 or more, more preferably 1.1 or more, furthermore preferably 1.2 or more.

The maximum value of the difference in y/x between y in the p-type semiconductor portion 10 and y in the n-type semiconductor portion 20 is preferably 0.05 or more, more preferably 0.1 or more, furthermore preferably 0.15 or more. In this manner, by increasing the maximum value of the difference in y/x, it is possible to simultaneously achieve the decrease of the thickness and the increase of the electromotive force at higher levels. Similarly to the y, the maximum difference in y/x, may be obtained, for example, as a difference between y/x obtained by converting the composition of the principal surface 100a of the p-type semiconductor portion 10 side of the semiconductor substrate 100 in terms of the composition ratio of the clathrate compound and y/x obtained by converting the composition of the principal surface 100b of the n-type semiconductor portion 20 side in terms of the composition ratio of the clathrate compound. The difference in y/x obtained in this manner is preferably 0.05 or more, more preferably 0.1 or more, furthermore preferably 0.15 or more.

From the viewpoint of increasing the above-described difference in y and the above-described difference in y/x, the y and the y/x in the p-type semiconductor portion 10, the pn junction 15, and the diffusion layer 22 of the n-type semiconductor portion 20 are preferably increased along the direction from the n-type semiconductor portion 20 toward the p-type semiconductor portion 10. The change in the concentration of such elements contributes to the distribution of a band gap of the semiconductor substrate 100 as described below.

Figure 2:
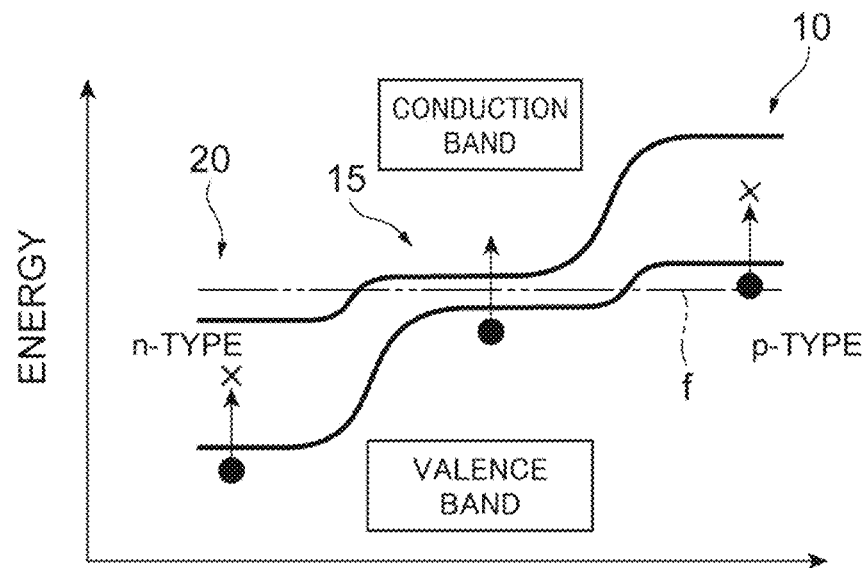
FIG. 2(A) is a conceptual view illustrating a state of thermal excitation when the semiconductor substrate according to an embodiment is heated to a predetermined temperature.
FIG. 2(B) is a conceptual view illustrating movement of electrons and holes when the semiconductor substrate according to an embodiment is heated to a predetermined temperature.
Figure 2:
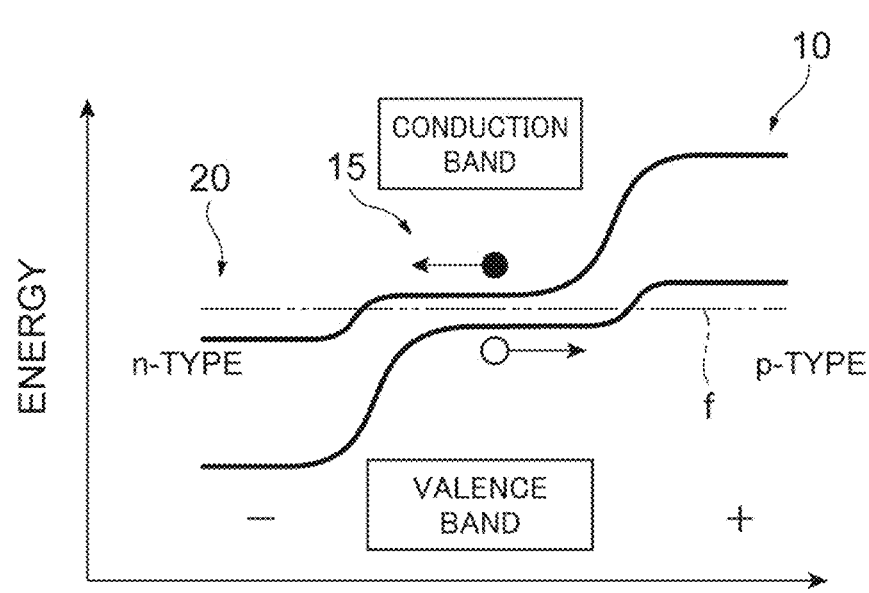

FIGS. 2(A) and 2(B) are conceptual views illustrating an example of the band gap state of the semiconductor substrate 100. In FIGS. 2(A) and 2(B), the vertical axis indicates electron energy, and the horizontal axis indicates the distance along the thickness direction of the semiconductor substrate 100 directing from the n-type semiconductor portion 20 side toward the p-type semiconductor portion 10 side. In the semiconductor substrate 100, it is possible to realize a band gap state illustrated in FIGS. 2(A) and FIG. 2(B) with a sufficiently small thickness.

As illustrated in FIGS. 2(A) and 2(B), the band gap at the pn junction 15 is smaller than the band gap in the p-type semiconductor portion 10 and the n-type semiconductor portion 20. In addition, the n-type semiconductor portion 20 is a portion where the Fermi level f is located in the conduction band side, and the p-type semiconductor portion 10 is a portion where the Fermi level f is located in the valence band side. The pn junction 15 has an intrinsic semiconductor portion, and the Fermi level f is located at the center of the forbidden band between the conduction band and the valence band.

FIG. 2(A) is a conceptual view illustrating a state of thermal excitation when the semiconductor substrate 100 is heated to a predetermined temperature. As illustrated in FIG. 2(A), when the semiconductor substrate 100 is heated to a predetermined temperature, electrons in the valence band are thermally excited to the conduction band. At this time, electrons are thermally excited to the conduction band only in the intrinsic semiconductor portion of the pn junction 15 of which the band gap is relatively small. On the other hand, in the p-type semiconductor portion 10 and the n-type semiconductor portion 20 of which band gap is larger than that in the intrinsic semiconductor portion, electrons are not thermally excited.

FIG. 2(B) is a conceptual view illustrating the movement of electrons (filled circles) and holes (open circles) when the semiconductor substrate 100 is heated to a predetermined temperature. As illustrated in FIG. 2(B), electrons excited to the conduction band having lower energy are moved to the n-type semiconductor portion 20 side. On the other hand, holes generated in the valence band side by the excitation of the electrons are moved to the p-type semiconductor portion 10 side having lower energy. Thus, the n-type semiconductor portion 20 is negatively charged, and the p-type semiconductor portion 10 is positively charged, so that the electromotive force is generated. In this manner, the semiconductor substrate 100 can generate power even if there is no temperature difference between the p-type semiconductor portion 10 and the n-type semiconductor portion 20. The mechanism of such electromotive force generation is different from the Seebeck effect causing the electromotive force to be generated on the basis of the temperature difference.

Since the semiconductor substrate 100 can generate power without a temperature difference, even in a case where the semiconductor substrate is modularized, or an equipment for temperature control of the cooling or heating or the like can be eliminated or can be simplified. In addition, since the semiconductor substrate can be thinned, it is possible to promote reducing the size of the module. Accordingly, the semiconductor substrate 100 can be suitably used as a power generation materials for thermoelectric conversion, or dissipated-heat recovery. For example, the semiconductor substrate can be installed as the power generation module in a transport equipment, device, plants, and the like of an automobile, an aircraft, or the like having an internal combustion engine.

A ratio of the width (energy gap) of the band gap of the pn junction 15 to the width (energy gap) of the band gap of the p-type semiconductor portion 10 and the n-type semiconductor portion 20 is not particularly limited, but it is preferably small. For example, the ratio may be 0.8 or less and may be 0.1 to 0.7. As the ratio is smaller, the temperature region where the power generation can be performed can be made sufficiently wider.

The energy gap of the pn junction 15 may be, for example, 0.4 eV or less and may be 0.05 to 0.3 eV. The energy gaps in the p-type semiconductor portion 10, the n-type semiconductor portion 20, and the pn junction 15, can be measured by, for example, inverse photoemission spectroscopy or the like.

As preferred examples of the clathrate compound of General Formula (I) contained in the semiconductor substrate 100, there are those of the following General Formulas (II) to (IV).

$$Ba_xAu_ySi_{46-y} \quad (II)$$

$$Ba_xAl_ySi_{46-y} \quad (III)$$

$$Ba_xCu_ySi_{46-y} \quad (IV)$$

In General Formula (II), x is 7 to 9, and y is 3.5 to 6. In General Formula (III), x is 7 to 9, and y is 11 to 17. In General Formula (IV), x is 7 to 9, and y is 3.5 to 6.

FIG. 3(A) is a view illustrating the band energy in the case of y=4 in the clathrate compound of General Formula (II). FIG. 3(B) is a view illustrating the band energy in the case of y=5 in the clathrate compound of General Formula (II). FIG. 3(C) is a view illustrating the band energy in the case of y=6 in the clathrate compound of General Formula (II).

FIG. 4(A) is a view illustrating the band energy in the case of y=14 in the clathrate compound of General Formula (III). FIG. 4(B) is a view illustrating the band energy in the case of y=15 in the clathrate compound of General Formula (III). FIG. 4(C) is a view illustrating the band energy in the case of y=16 in the clathrate compound of General Formula (III).

FIG. 5(A) is a view illustrating the band energy in the case of y=4 in the clathrate compound of General Formula (IV). FIG. 5(B) is a view illustrating the band energy in the case of y=5 in the clathrate compound of General Formula (IV). FIG. 5(C) is a view illustrating the band energy in the case of y=6 in the clathrate compound of General Formula (IV).

Figure 3:
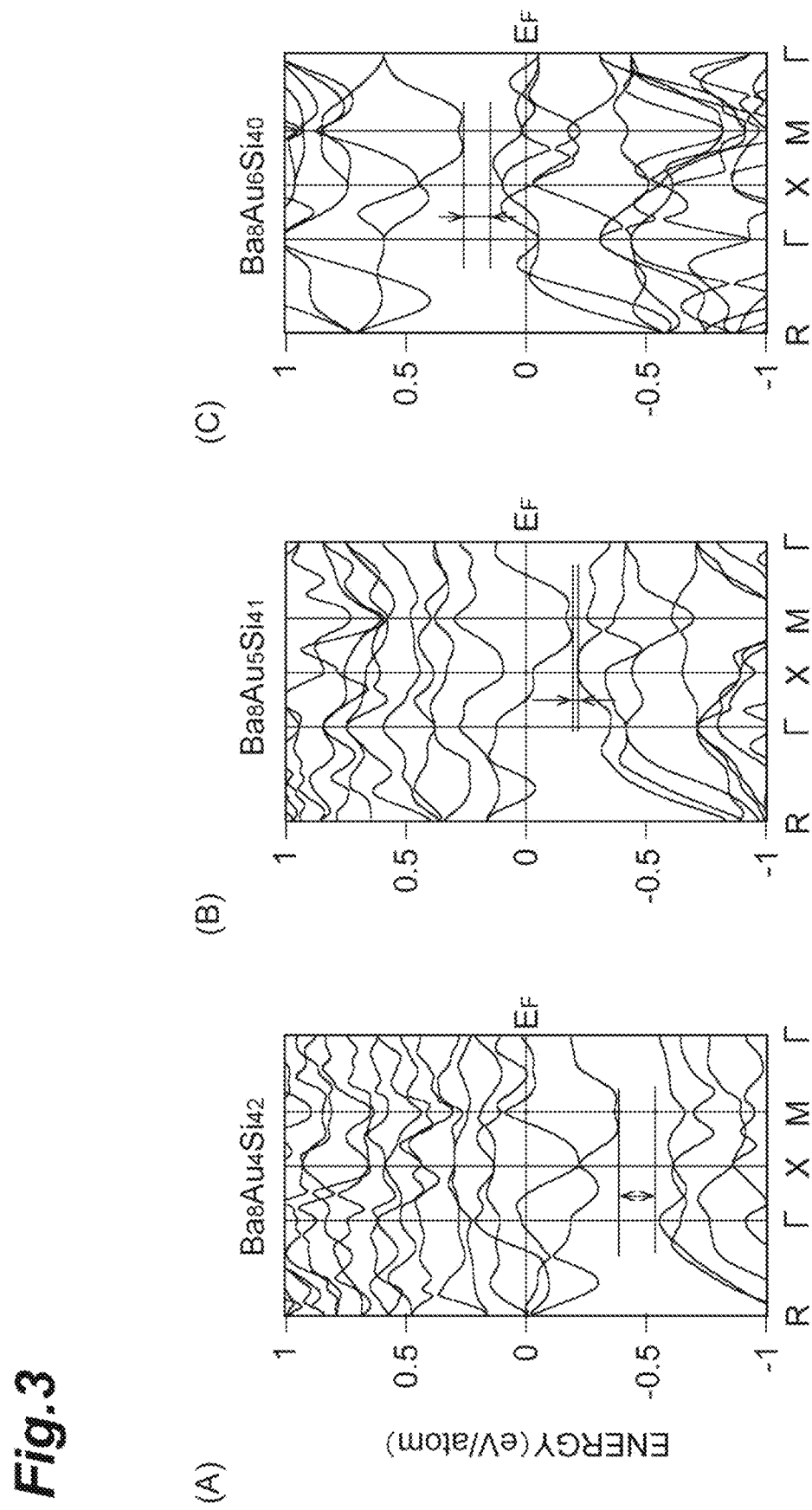
FIG. 3(A) is a view illustrating band energy in the case of y=4 in a clathrate compound of $Ba_8Au_ySi_{46-y}$.
FIG. 3(B) is a view illustrating the band energy in the case of y=5 in the clathrate compound of $Ba_8Au_ySi_{46-y}$.
FIG. 3(C) is a view illustrating the band energy in the case of y=6 in the clathrate compound of $Ba_8Au_ySi_{46-y}$.
Figure 4:
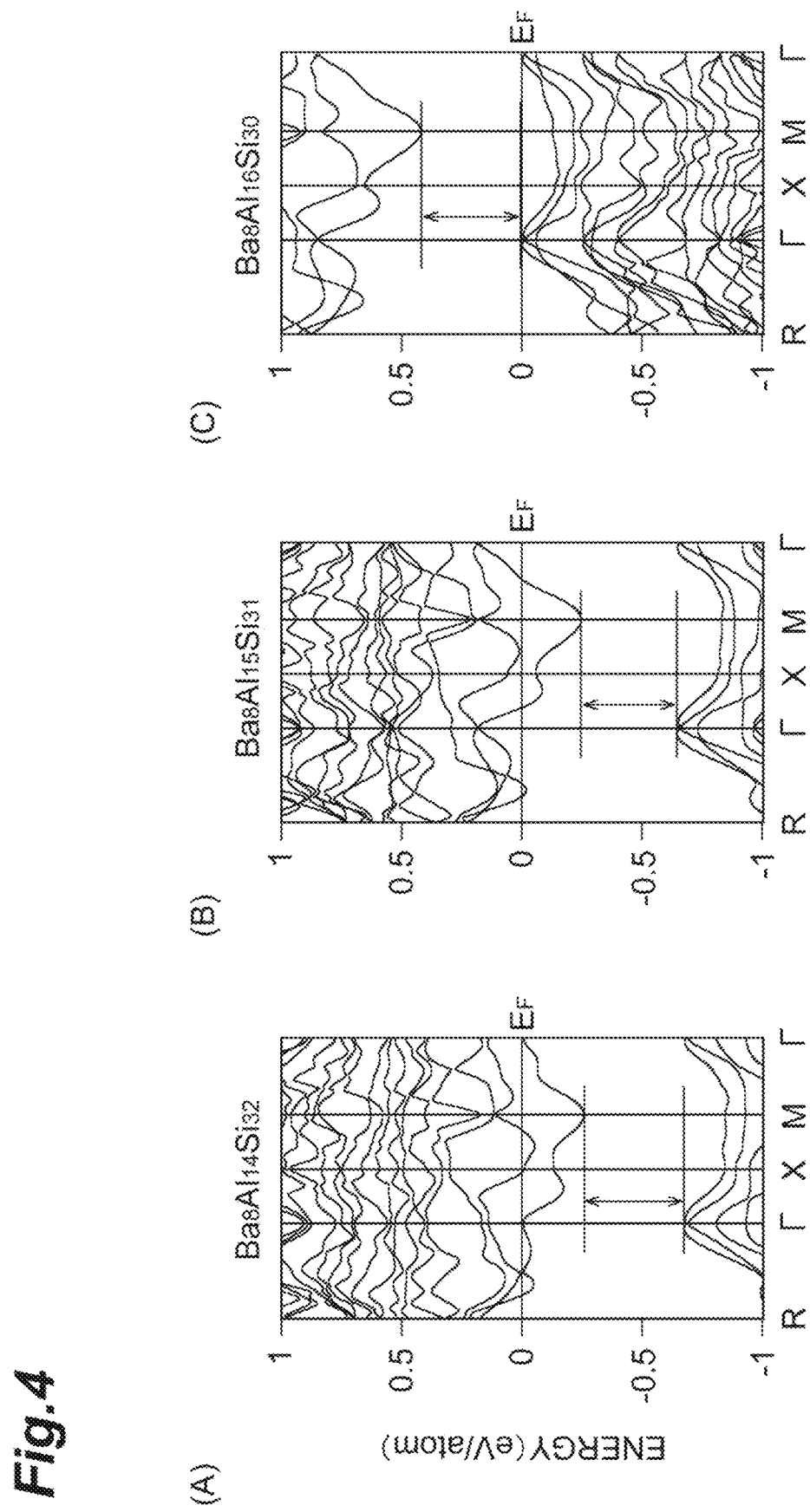
FIG. 4(A) is a view illustrating the band energy in the case of y=14 in a clathrate compound of $Ba_8Al_ySi_{46-y}$.
FIG. 4(B) is a view illustrating the band energy in the case of y=15 in the clathrate compound of $Ba_8Al_ySi_{46-y}$.
FIG. 4(C) is a view illustrating the band energy in the case of y=16 in the clathrate compound of $Ba_8Al_ySi_{46-y}$.
Figure 5:
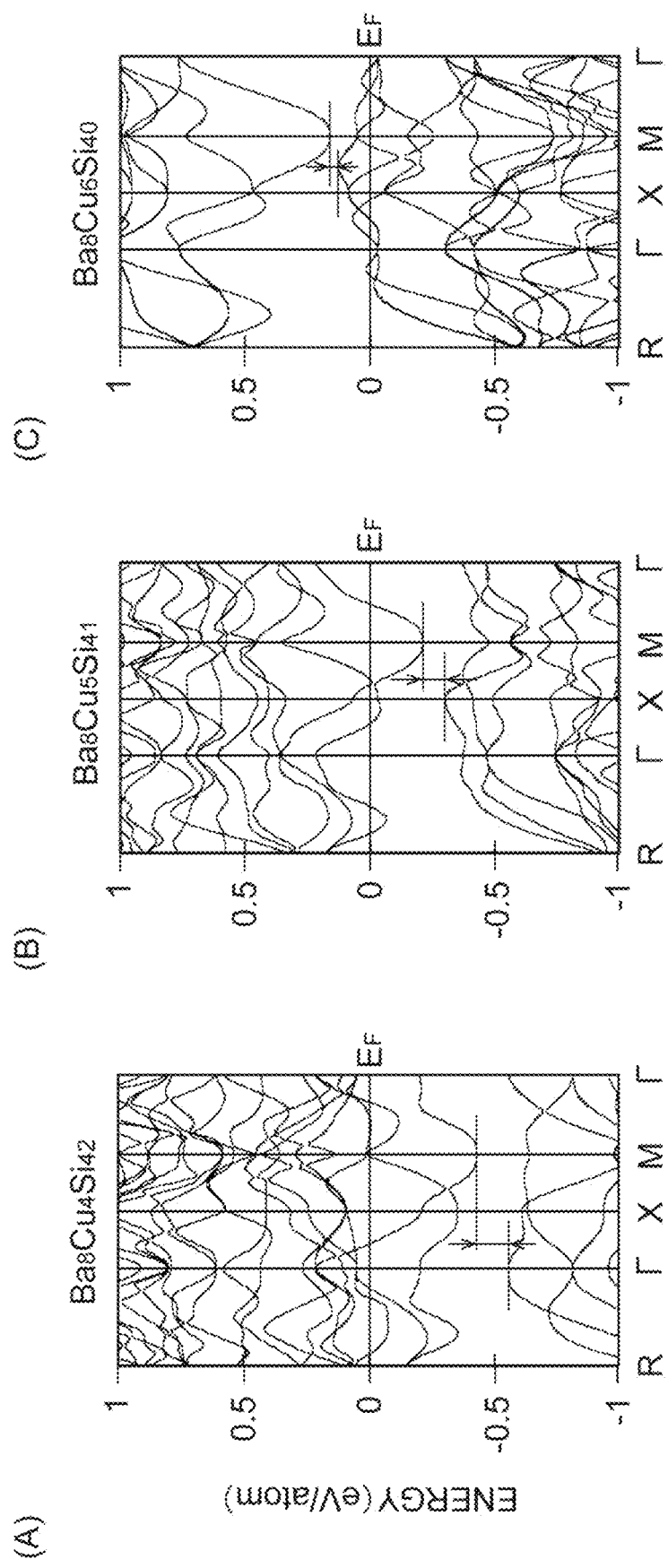
FIG. 5(A) is a view illustrating the band energy in the case of y=4 in a clathrate compound of $Ba_8Cu_ySi_{46-y}$.
FIG. 5(B) is a view illustrating the band energy in the case of y=5 in the clathrate compound of $Ba_8Cu_ySi_{46-y}$.
FIG. 5(C) is a view illustrating the band energy in the case of y=6 in the clathrate compound of $Ba_8Cu_ySi_{46-y}$.

The band energies illustrated in (A), (B), and (C) in each of FIG. 3, FIG. 4, and FIG. 5 are derived by using the first principle calculation software Advance/PHASE. In the deriving, from the viewpoint of calculation speed and calculation accuracy, a density functional method is used, and PBE-GGA is used for the exchange interaction potential. As the calculation method, a projector augmented wave (PAW) method is used. The number of K-Points is set to 4×4×4=64 points, and the cut off energy is set to 340 eV. The widths of the band gaps (energy gap) obtained from FIGS. 3, 4, and 5 are listed in Table 1.

TABLE 1

| Clathrate compound | Width of band gap (eV) |
|---|---|
| $Ba_8Au_4Si_{42}$ | 0.17 |
| $Ba_8Au_5Si_{41}$ | 0.02 |
| $Ba_8Au_6Si_{40}$ | 0.13 |
| $Ba_8Al_{14}Si_{32}$ | 0.41 |
| $Ba_8Al_{15}Si_{31}$ | 0.39 |
| $Ba_8Al_{16}Si_{30}$ | 0.42 |
| $Ba_8Cu_4Si_{42}$ | 0.13 |
| $Ba_8Cu_5Si_{41}$ | 0.09 |
| $Ba_8Cu_6Si_{40}$ | 0.03 |

From the results listed in Table 1, it can be seen that, in the case of the clathrate compound of General Formula (II), the width of the band gap in the composition of y=5 is considerably smaller than that in the composition of y=4 and y=6. That is, the width of the band gap of the clathrate compound of General Formula (II) highly depends on the molar ratio of Au. On the other hand, it can be seen that, in the case of the clathrate compound of General Formula (III) or the like, the width of the band gap in the composition of y=15 is slightly smaller than that in the composition of y=14 and y=16. That is, although the width of the band gap of the clathrate compound B of General Formula (III) depends on the molar ratio of Al, the dependence is smaller than that of the molar ratio of Au in the clathrate compound of General Formula (II).

According to Table 1, the clathrate compound of General Formula (II) has a larger difference in the width of the band gap than the clathrate compound of General Formula (III). The semiconductor substrate 100 containing the clathrate compound having a large difference in the width of the band gap in this manner can generate the electromotive force in a wider temperature range. Therefore, it is possible to configure a power generation material having higher versatility. However, the clathrate compound of General Formula (III) is also a promising power generation material which causes an electromotive force in a predetermined temperature range.

It can be seen that, in the case of the clathrate compound of General Formula (IV), the width of the band gap in the composition of y=6 is considerably smaller than that in the composition of y=4 and y=5. That is, the width of the band gap of the clathrate compound of General Formula (IV) highly depends on the molar ratio of Cu. The clathrate compound of General Formula (IV) has a larger difference in the width of the band gap than the clathrate compound of General Formula (III). The semiconductor substrate 100 containing the clathrate compound of General Formula (III) can also generate the electromotive force in a wide temperature range. Therefore, it is possible to configure a power generation material having higher versatility.

The semiconductor substrate 100 may contain components different from the above-described clathrate compound. For example, a metal alone of the element B in General Formula (I) may be contained. For example, the p-type semiconductor portion 10 may contain a larger amount of such a metal than the n-type semiconductor portion 20.

Figure 6:
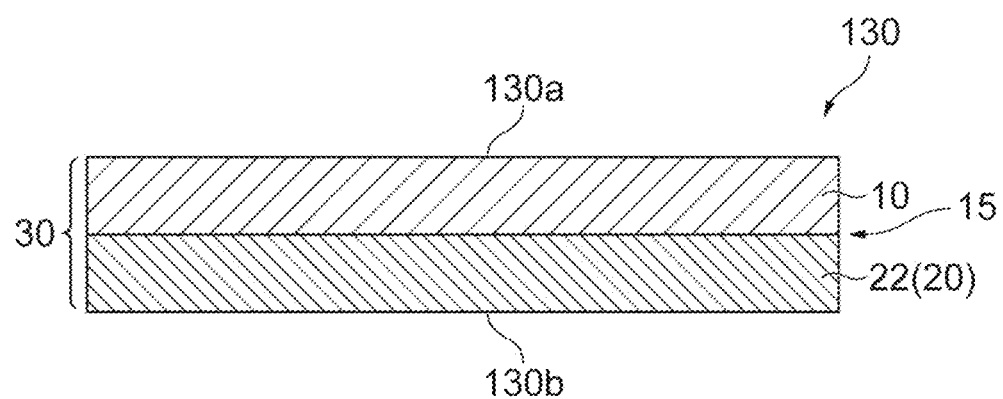
FIG. 6 is a cross-sectional view schematically illustrating a semiconductor substrate according to another embodiment.

FIG. 6 is a cross-sectional view schematically illustrating a semiconductor substrate according to another embodiment. A semiconductor substrate 130 has, for example, a flat plate shape and includes a p-type semiconductor portion 10 and an n-type semiconductor portion 20 in this order from the upper side along a thickness direction (vertical direction in FIG. 6). The semiconductor substrate 130 includes a pn junction 15 between the p-type semiconductor portion 10 and the n-type semiconductor portion 20.

The n-type semiconductor portion 20 of the semiconductor substrate 130 is different from that of the semiconductor substrate 100 in FIG. 1 in that the n-type semiconductor portion 20 does not have the base layer 24 and is formed with only the diffusion layer 22. Other configurations of the semiconductor substrate 130 may be the same as those of the semiconductor substrate 100. In this manner, since the semiconductor substrate 130 does not have the base layer 24, it is possible to further reduce the thickness as compared with the semiconductor substrate 100. The semiconductor substrate 130 may have a substrate-like shape and may have, for example, a film-like shape (semiconductor film) of which thickness is set to 0.1 mm or less or 0.01 mm or less. Such a film-like semiconductor substrate 130 may be produced by performing, for example, machining such as grinding or cutting on the semiconductor substrate 100 and may be produced by using the semiconductor base having a small thickness in the method for producing a semiconductor substrate described later. Alternatively, a semiconductor substrate may be &mined on a base different from the semiconductor base.

In the variable-composition layer 30 of the semiconductor substrate 130, the rate of change in y in the thickness direction may be $1\times10^{-4}/\mu m$ or more throughout the variable-composition layer. In this case, the rate of change in y can be obtained by dividing the difference in y obtained by converting the composition on a principal surface 130a of one side of the semiconductor substrate 130 and on a principal surface 130b of the other side thereof in terms of the composition ratio of the clathrate compound by the thickness of the semiconductor substrate 130. From the viewpoint of obtaining a sufficiently large electromotive force, the difference in y obtained by measuring the composition of the clathrate compound in the principal surface 130a of the one side and the principal surface 130b of the other side is preferably 1 or more, more preferably 1.1 or more, furthermore preferably 1.2 or more.

The above-described semiconductor substrate 100 (130) may have an arbitrary surface layer as Modified Example thereof. Such a surface layer may be provided on the principal surface 100a (130a) side so as to cover at least a portion of the p-type semiconductor portion 10. In addition, the surface layer may be provided on the principal surface 100b (130b) side so as to cover at least a portion of the n-type semiconductor portion 20. As the surface layers, metal layers or alloy layers can be exemplified. The metal layer or the alloy layer may contain an element B of General Formula (I) and may contain a metal used for the electrode or the like.

A plurality of the semiconductor substrates 100 (130) may be arranged, for example, on a tape-shaped elongate base along the longitudinal direction of the elongate base to configure a wire rod, and a plurality of the semiconductor substrates 100 (130) may be laminated on each other to configure a laminate. In addition, a plurality of the laminates may be arranged on the elongate base along the longitudinal direction of the elongate base to configure a wire rod.

Figure 7:
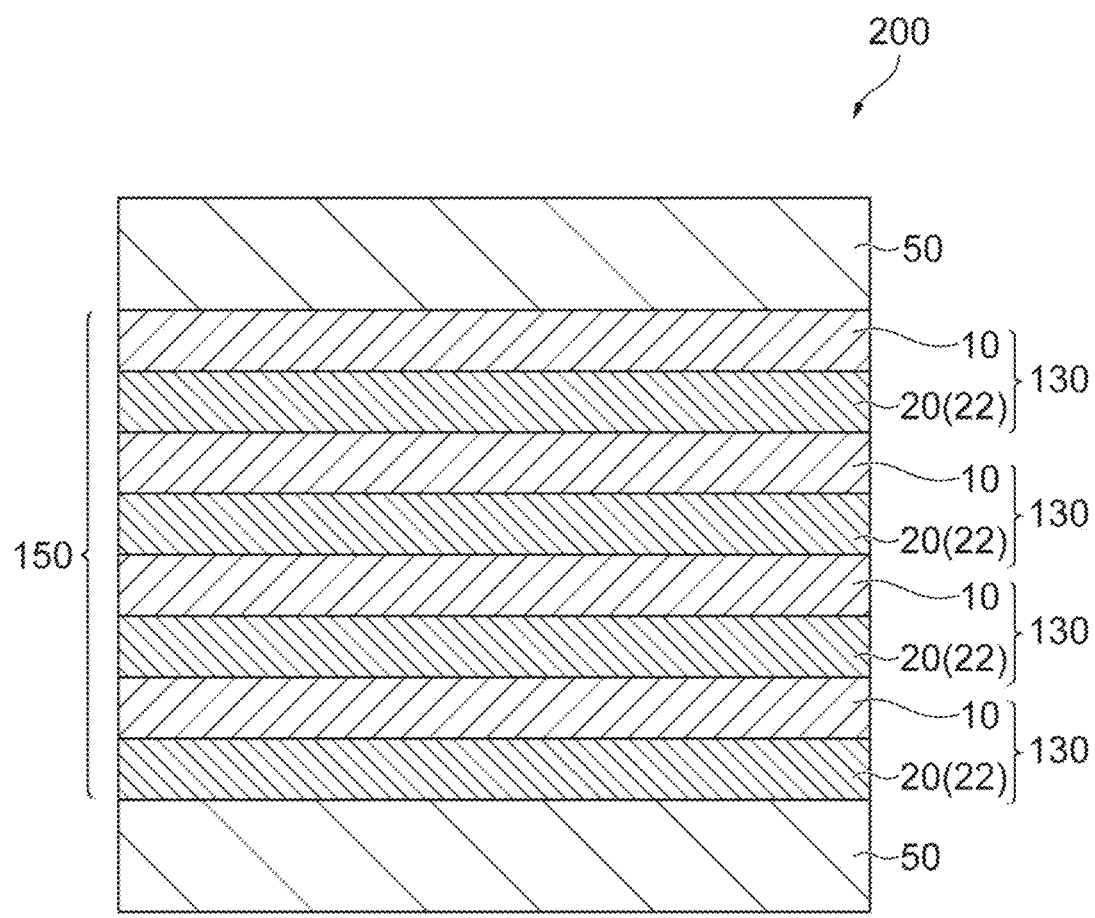
FIG. 7 is a cross-sectional view schematically illustrating a laminate according to an embodiment.

FIG. 7 is a cross-sectional view schematically illustrating a laminate according to an embodiment. The laminate 200 includes a pair of electrodes 50 and, in the meantime, a laminated portion 150 obtained by laminating a plurality of the semiconductor substrates 130 so that the semiconductor substrates 130 are adjacent to each other in the thickness direction thereof. The plurality of the semiconductor substrates 130 arranged to be adjacent to each other in the laminated portion 150 are laminated so that the p-type semiconductor portion 10 and the n-type semiconductor portion 20 are in contact with each other. For this reason, the increasing and decreasing directions of y of each of the semiconductor substrates 130 constituting the laminated portion 150 are the same.

Since the directions (positive and negative directions) of the electromotive forces of the semiconductor substrates 130 constituting the laminated portion 150 coincide with each other, the electromotive force of the entire laminate 200 is substantially equal to the sum of the electromotive forces of the semiconductor substrates 130. For this reason, it is possible to obtain a sufficiently large electromotive force. Since the thickness of the semiconductor substrate 130 is sufficiently small, it is possible to allow the thickness of the laminate 200 where a plurality of the semiconductor substrates are laminated to be small. The thickness of the laminate 200 is not particularly limited, and for example, the thickness of the laminate may be 30 mm or less and may be 10 mm or less.

In FIG. 7, the laminate 200 including the laminated portion 150 obtained by laminating a plurality of the semiconductor substrates 130 was illustrated, but the present invention is not limited thereto. For example, a laminate may be configured by using the semiconductor substrates 100 instead of the semiconductor substrates 130, and a laminate may be configured by using both of the semiconductor substrates 130 and the semiconductor substrates 100. The number of the semiconductor substrates 130 or the semiconductor substrates 100 constituting the laminated portion 150 is not particularly limited. A portion of the electrode 50 and the laminated portion 150 may be removed by etching, and a pattern may be formed.

A power generation module using the laminate 200 or the semiconductor substrate 100 (130) is produced, and a power generation method can also be performed. Known configurations can be used as the configurations of the power generation module other than the laminate 200 or the semiconductor substrate 100 (130). By heating the laminate 200 or the semiconductor substrate 100 (130), for example, to 50 to 700° C., preferably to 200 to 500° C., it is possible to efficiently generate power. For the semiconductor substrate 100 (130), the absolute value of the potential difference between both ends at for example, 400° C. can be set to 0.3 mV or more or 0.5 mV or more. Therefore, by configuring the laminate, it is possible to obtain a sufficiently large electromotive force.

Hereinafter, an embodiment of a method for producing a semiconductor substrate is described. The producing method according to this embodiment includes a step of producing an n-type semiconductor substrate containing a clathrate compound of General Formula (I), a step of forming a coating layer where a molar concentration of an element B in General Formula (I) is higher than that in the n-type semiconductor base so as to cover at least a portion of a surface of the substrate, and a step of forming a pn junction by heating the substrate where the coating layer is formed to diffuse the element B into an interior of the n-type semiconductor base. Hereinafter, it is described in detail.

A metal or metalloid corresponding to the element A, the element B, and the element C which are constituent elements in General Formula (I) is prepared. Then, predetermined amounts of the prepared metal and metalloid are weighed in accordance with the composition of the final product. Weighing is performed in a closed container which is substituted with an inert gas as needed. The weighed metal and metalloid are placed into a copper mold and are dissolved by an arc melting method or the like. The temperature of the melted metal in the arc dissolving is, for example, about 3000° C.

When the melted liquid obtained by the arc melting is cooled, an ingot of the clathrate compound of General Formula (I) is obtained. By crushing the obtained ingot, particles of the clathrate compound may be utilized. By melting the particles in a crucible and, after that, performing cooling, an n-type semiconductor substrate having a predetermined shape is obtained. The obtained n-type semiconductor substrate may be processed to have a desired shape (for example, a flat plate shape).

A coating layer is formed on the surface of the obtained n-type semiconductor substrate. The coating layer is a layer where a molar concentration of the element B in General Formula (I) is higher than that in the n-type semiconductor base. The coating layer can be formed by a known method such as sputtering, vapor deposition, a molecular beam epitaxy method, a laser ablation method, a chemical vapor deposition method, a liquid phase method, or the like. The coating layer may be a film of alloy or a film of a compound containing at least one element B as a constituent element and may be a metal film made of the element B.

Figure 8:
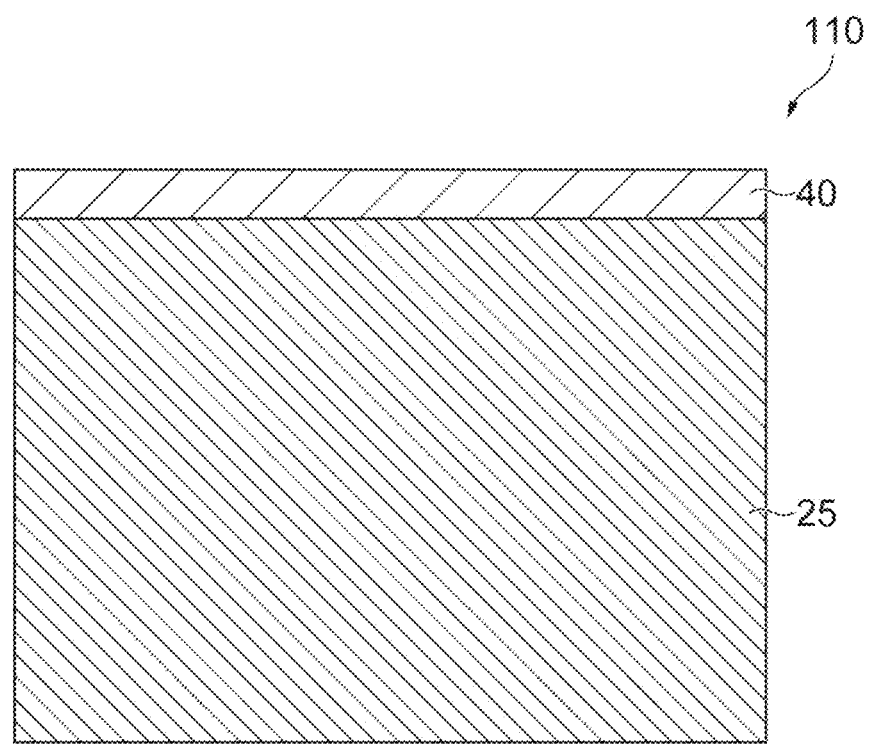
FIG. 8 is a cross-sectional view schematically illustrating a substrate according to an embodiment.

FIG. 8 is a cross-sectional view schematically illustrating an example of a substrate including a coating layer. The substrate 110 of FIG. 8 has, for example, a flat plate shape and includes an n-type semiconductor base 25 containing a clathrate compound having a composition of General Formula (I) and a coating layer 40 where the molar concentration of the element B is higher than the n-type semiconductor base 25 on one principal surface of the n-type semiconductor base 25. The thickness of the coating layer 40 may be, for example, 0.1 to 5 μm and may be 0.5 to 3 μm. The thickness of the n-type semiconductor base 25 may be, for example, 0.001 to 5 mm. By varying the thickness of the n-type semiconductor base 25, it is possible to adjust the thickness of the semiconductor substrate 100 (130).

Next, by heating the substrate 110, the element B contained in the coating layer 40 is diffused into the interior of the n-type semiconductor base 25, so that a pn junction is formed in the n-type semiconductor base 25. The heating temperature is, for example, 300 to 1000° C., and from the viewpoint of efficiently diffusing the element B, the heating temperature is preferably 700 to 1000° C., more preferably 800 to 1000° C. Heating time at the heating temperature may be 1 minute to 300 minutes and may be 1 to 180 minutes. The heating is preferably performed in an inert gas atmosphere of argon gas, nitrogen gas, or the like.

Through the above steps, it is possible to obtain the semiconductor substrate 100 (130) including the variable-composition layer 30 where composition varies along the thickness direction and which includes the pn junction 15. At least a portion of the coating layer may remain on the surface of the semiconductor substrate. The remaining coating layer may be removed by a processing method such as polishing or cutting. In this manner, it is possible to obtain the semiconductor substrate 100 (130). The method for producing the semiconductor substrate 100 (130) is not limited to the above-described method, but for example, the semiconductor substrate 100 (130) may be formed on another base different from the n-type semiconductor base 25.

Heretofore, several embodiments of the present invention are described, but the present invention is not limited to the embodiments described above. For example, the semiconductor substrate, the substrate, and the laminate according to the above-described embodiments are described to has a flat plate shape (quadrangular cylindrical shape), but the present invention is not limited to such a shape. In other embodiments, the semiconductor substrate and the substrate may have a polygonal cylindrical shape other than the quadrangular cylindrical shape and may have a circular cylindrical shape or an elliptical cylindrical shape. In addition, the semiconductor substrate and the substrate may have a curved shape and may be processed into a special shape different from these shapes. In the variable-composition layer, it is not essential that the composition of the clathrate compound along the thickness direction is always uniformly inclined, and the composition of a partial region of the variable-composition layer may be inclined in the opposite direction to the extent that the desired electromotive force can be obtained.

EXAMPLE

The present invention will be described more specifically by using Examples and Comparative Examples below, but the present invention is not limited to these Examples.

[Production and Composition Evaluation of Semiconductor Substrate]

Example 1

<Production of Base>

Commercial Ba powder, Au powder, and Si powder (all having high purity) were prepared. These powders were weighed so that Ba Au:Si=8:4:42 (molar ratio). Each powder weighed was put into a Cu mold, and the mold was placed in the chamber. After replacing the interior of the chamber with argon gas, heating was performed at about 2000° C. by an arc melting method to melt the powder in the Cu mold. A bulk of the clathrate compound ($Ba_8Au_4Si_{42}$) was produced in this manner. The bulk was processed into a flat plate shape (length×width×thickness=4 mm×4 mm×2 mm), so that an n-type semiconductor base made of the clathrate compound was obtained.

A deposition film (thickness: about 1 μm) of gold as the coating layer was formed on one principal surface of the n-type semiconductor base by using a bipolar plate electrode type sputtering apparatus (manufactured by Sanyu Electron Co., Ltd., apparatus name: SC-701 QUICK COATER). The substrate including the n-type semiconductor base and the deposition film of gold on one principal surface of the n-type semiconductor base was obtained in this manner.

<Production of Semiconductor Substrate having pn Junction>

The substrate produced as described above was loaded into a tubular electric furnace, and heating was performed in an argon gas atmosphere. As the heating condition, the temperature was raised up to 900° C. at a temperature rising rate of about 30° C./min and held for 5 minutes at 900° C. After that, natural cooling was performed down to a room temperature at a rate of about 3° C./min. A semiconductor substrate was produced in this manner. Although there was metallic luster due to a deposition film of gold on the principal surface of the substrate before the heating, no metallic luster was observed in the semiconductor substrate after the heating. This denotes that gold is diffused into the semiconductor substrate.

<Evaluated of Semiconductor Substrate 1>

The produced semiconductor substrate was cut along the thickness direction. Then, the cut plane was observed by using a scanning electron microscope (SEM) and an electron probe microanalyzer (EPMA). In addition, composition analysis of the cut plane was performed by using energy dispersive X-ray spectroscopy (EDX) and wavelength dispersive X-ray spectroscopy (WDX).

Figure 9:
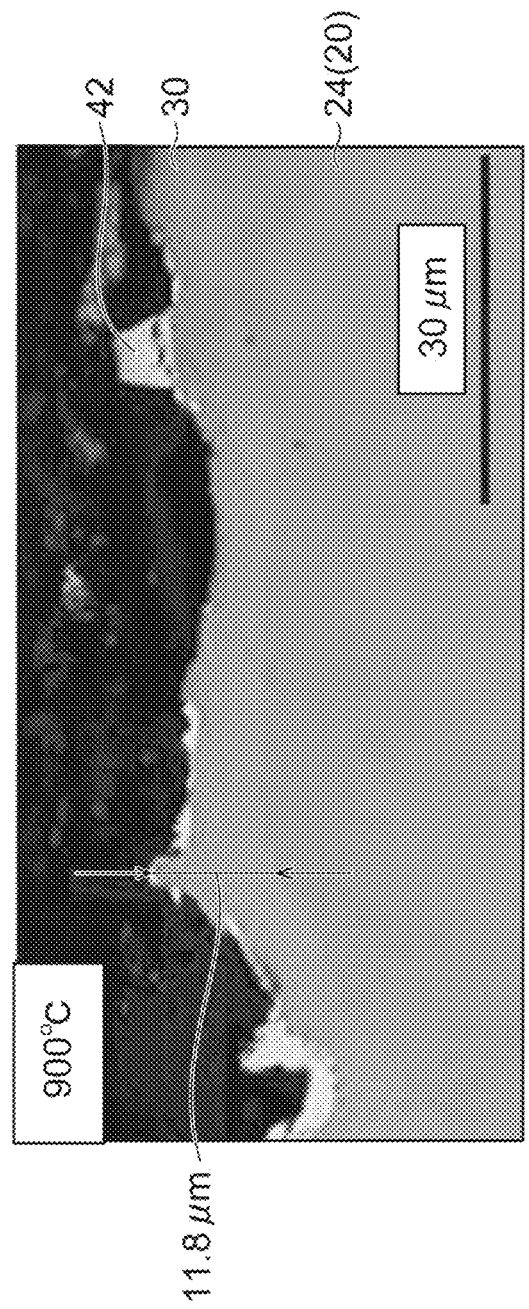
FIG. 9 is a photograph showing an EPMA image of a cut plane taken along the thickness direction in the vicinity of a principal surface of a semiconductor substrate according to Example 1.

FIG. 9 is a photograph showing an EPMA image of a cut plane along the thickness direction in the vicinity of a principal surface (principal surface where a deposition film of gold exists) of the semiconductor substrate. As shown in FIG. 9, in the principal surface side (the principal surface where a deposition film of gold was formed) of the semiconductor substrate, the variable-composition layer 30 of which contrast was different from the inner side due to the diffusion of gold was formed. The thickness of the variable-composition layer 30 was 11.8 μm at the maximum and about 9.3 μm in average. In addition, the variable-composition layer 30 had a surface layer 42 containing gold alone and the clathrate compound on the principal surface side.

Figure 10:
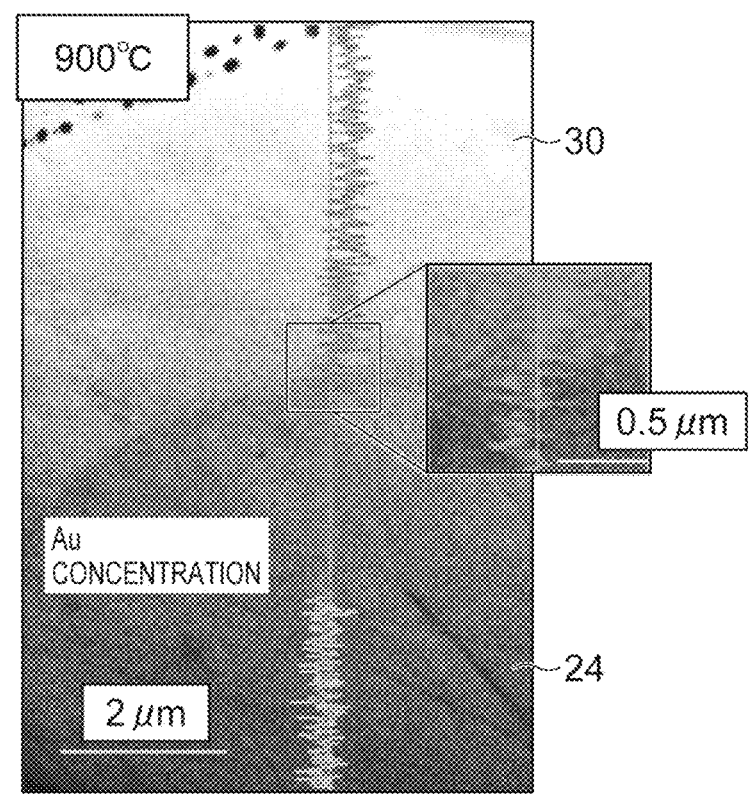
FIG. 10 is a photograph showing an image and analysis results of an SEM-EDX composition analysis performed after further expanding the cut plane shown in FIG. 9.

FIG. 10 is a photograph showing an image and analysis results of an SEM-EDX composition analysis performed after further expanding the cut plane shown in FIG. 9. The line longitudinally traversing the vicinity of the center in this photograph is a result of a line analysis of gold (Au) concentration, and it represents that, as the line is more deflected on the right side of FIG. 10, the gold concentration becomes higher. It was confirmed from the result that the variable-composition layer 30 where the composition of the clathrate compound varied along the thickness direction was formed in the vicinity of the principal surface of the semiconductor substrate. In addition, the base layer 24 where the composition did not vary along the thickness direction existed in the lower side of the variable-composition layer 30 (inner side of the semiconductor substrate).

Figure 11:
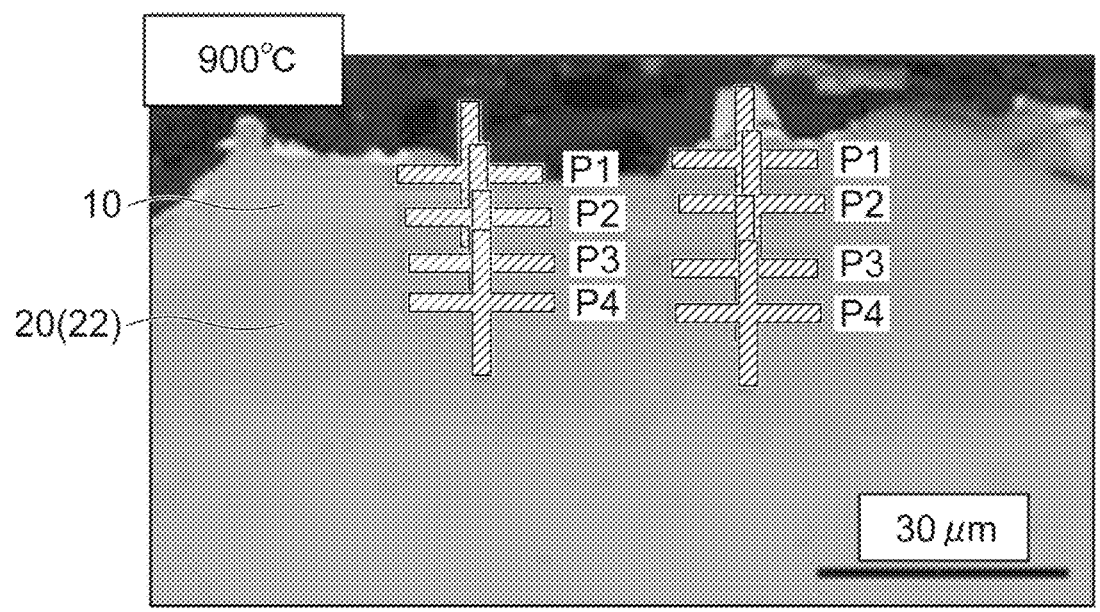
FIG. 11 is a photograph of an EPMA image of the same cut plane as those of FIGS. 9 and 10.

FIG. 11 is a photograph of an EPMA image of the same cut plane as those of FIGS. 9 and 10. In FIG. 11, point analysis was performed for the positions of P1 to P4 added with the cross marks by using an EPMA-WDX apparatus (manufactured by SHIMADZU CORPORATION, apparatus name: EPMA-1720). The point analysis was performed for a total of eight points at each of the points of P1, P2, P3, and P4 as shown in FIG. 11. The points located in equivalent depth from the principal surface of the semiconductor substrate were denoted by the same reference numerals of P1 to P4, and the arithmetic mean value at each of P1 to P4, in the elemental analysis was calculated. The arithmetic mean values obtained were converted in terms of the composition ratio of the clathrate compound of General Formula (II) and were listed in Table 2.

The "Distance" of P2 to P4 of Table 2 is the distance from P1 measured along the thickness direction of the semiconductor substrate. In addition, since there are two points for each of P1 to P4, the arithmetic mean value of each distance was listed in Table 2.

TABLE 2

| Position | Ba (x) | Au (y) | Si (46 − y) | Au/Ba (y/x) | Distance (μm) | Rate of change in y (μm$^{-1}$) | L (μm) | Type of semiconductor |
|---|---|---|---|---|---|---|---|---|
| P1 | 7.15 | 6.34 | 39.66 | 0.89 | 0 (Reference value) | — | — | p-type semiconductor portion |
| P2 | 7.56 | 6.12 | 39.88 | 0.81 | 3.2 | 0.24 | 4.1 | p-type semiconductor portion |
| P3 | 7.60 | 4.89 | 41.11 | 0.64 | 8.3 | | | n-type semiconductor portion |
| P4 | 7.61 | 4.90 | 41.10 | 0.64 | 11.9 | — | — | n-type semiconductor portion |

In the case of the clathrate compound of General Formula (II), theoretically, the portion where y is larger than 5.33 corresponds to the p-type semiconductor portion, and the portion where y is smaller than 5.33 corresponds to the n-type semiconductor portion. It was confirmed from the results in Table 2 that the region from P1 to P3 belongs to the variable-composition layer where the composition of the clathrate compound of General Formula (II) varies along the thickness direction.

A pn junction is fanned between P2 and P3 so as to cross FIG. 11. Table 2 listed the "Rate of change in y" between P2 and P3 adjacent to each other in the thickness direction. The "Rate of change in y" is a value obtained by dividing the amount of change in y (Δ=6.12−4.89=1.23) by the distance (8.3−3.2=5.1 μm) between P2 and P3. "L" in Table 2 represents the distance in the thickness direction required to change the y by 1 in a case where the y is changed at the "Rate of change in y". The "L" can also be obtained as a reciprocal of the "Rate of change in y".

According to this evaluation, the rate of change in y of the variable-composition layer in the portion including the pn junction was 0.24/μm.

<Evaluation of Semiconductor Substrate 2>

Figure 12:
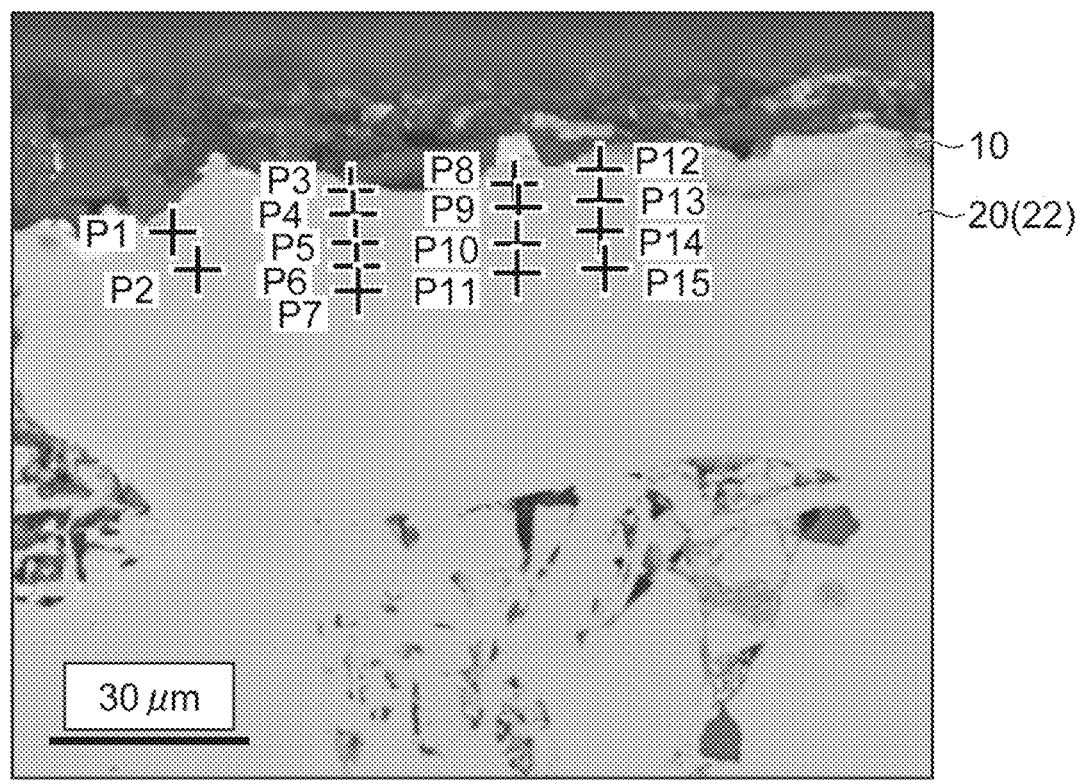
FIG. 12 is a photograph of an EPMA image of the same cut plane as that of FIG. 11.

The point analysis was performed for different positions in the same cut plane as the cut plane evaluated in the "Evaluation of Semiconductor Substrate 1" described above. FIG. 12 is a photograph of an EPMA image of the same cut plane as that of FIG. 11. Then, in FIG. 12, point analysis was performed for the positions of P1 to P15 added with the cross marks by using the EPMA-WDX in the same manner as in the "Evaluation of Semiconductor Substrate 1". The results of the point analysis were converted in terms of the composition ratio of the clathrate compound of General Formula (II) and were listed in Tables 3 to 5.

The "Distance" of P2 of Table 3 is a distance from P1 along the thickness direction of the semiconductor substrate by setting P1 as a starting point. The "Distance" of P4 to P7 of Table 4 is a distance from P3 along the thickness direction of the semiconductor substrate by setting P3 as a starting point. The "Distance" of P9 to P11 of Table 5 is a distance from P8 along the thickness direction of the semiconductor substrate by setting P8 as a starting point. The "Distance" of P13 to P15 of Table 6 is a distance from P12 along the thickness direction of the semiconductor substrate by setting P12 as a starting point. The items in Tables 3 to 6 have the same meanings as the respective items in Table 2.

TABLE 3

| Position | Ba (x) | Au (y) | Si (46 − y) | Au/Ba (y/x) | Distance (μm) | Rate of change in y ($\mu m^{-1}$) | L (μm) | Type of semiconductor |
|---|---|---|---|---|---|---|---|---|
| P1 | 7.32 | 6.24 | 39.76 | 0.85 | 0 (Reference value) | 0.22 | 4.5 | p-type semiconductor portion |
| P2 | 7.52 | 4.79 | 41.21 | 0.64 | 6.5 | | | n-type semiconductor portion |

As listed in Table 3, the region between P1 and P2 belongs to the variable-composition layer because the composition varies. Then, it was found that there was a pn junction between P1 and P2. The "Rate of change in y" between P1 and P2 was 0.22/μm.

TABLE 4

| Position | Ba (x) | Au (y) | Si (46 − y) | Au/Ba (y/x) | Distance (μm) | Rate of change in y ($\mu m^{-1}$) | L (μm) | Type of semiconductor |
|---|---|---|---|---|---|---|---|---|
| P3 | 7.01 | 6.09 | 39.91 | 0.87 | 0 (Reference value) | — | — | p-type semiconductor portion |
| P4 | 7.48 | 6.15 | 39.85 | 0.82 | 3.9 | 0.33 | 3.0 | p-type semiconductor portion |
| P5 | 7.58 | 4.87 | 41.13 | 0.64 | 7.8 | | | n-type semiconductor portion |
| P6 | 7.50 | 4.89 | 41.11 | 0.65 | 11.0 | — | — | n-type semiconductor portion |
| P7 | 7.62 | 4.85 | 41.15 | 0.64 | 14.9 | — | — | n-type semiconductor portion |

As listed in Table 4, the region of P3 to P7 belongs to the variable-composition layer because the composition varies. Then, it was found that there was a pn junction between P4 and P5. The "Rate of change in y" between P4 and P5 was 0.33/μm.

TABLE 5

| Position | Ba (x) | Au (y) | Si (46 − y) | Au/Ba (y/x) | Distance (μm) | Rate of change in y ($\mu m^{-1}$) | L (μm) | Type of semiconductor |
|---|---|---|---|---|---|---|---|---|
| P8 | 7.28 | 6.58 | 39.42 | 0.90 | 0 (Reference value) | — | — | p-type semiconductor portion |
| P9 | 7.64 | 6.09 | 39.91 | 0.80 | 3.3 | 0.23 | 4.3 | p-type semiconductor portion |
| P10 | 7.62 | 4.91 | 41.09 | 0.64 | 8.4 | | | n-type semiconductor portion |
| P11 | 7.72 | 4.91 | 41.09 | 0.64 | 13.0 | — | — | n-type semiconductor portion |

As listed in Table 5, the region of P8 to P10 belongs to a variable-composition layer because the composition varies. Then, it was found that there was a pn junction between P9 and P10. The "Rate of change in y" between P9 and P10 was 0.23/μm.

TABLE 6

| Position | Ba (x) | Au (y) | Si (46 − y) | Au/Ba (y/x) | Distance (μm) | Rate of change in y (μm$^{-1}$) | L (μm) | Type of semiconductor |
|---|---|---|---|---|---|---|---|---|
| P12 | 7.33 | 6.57 | 39.43 | 0.90 | 0 (Reference value) | 0.34 | 2.9 | p-type semiconductor portion |
| P13 | 7.58 | 4.99 | 41.01 | 0.66 | 4.6 | | | n-type semiconductor portion |
| P14 | 7.52 | 4.81 | 41.19 | 0.64 | 9.2 | | | n-type semiconductor portion |
| P15 | 7.73 | 4.88 | 41.12 | 0.63 | 15.0 | — | — | n-type semiconductor portion |

As listed in Table 6, the region of P12 to P15 belongs to a variable-composition layer because the composition varies. Then, it was found that there was a pn junction between P12 and P13. In addition, since P13 is close to 5.33 which is a theoretical value, it is estimated that there is a pn junction in the vicinity of P13. The "Rate of change in y" between P12 and P13 was 0.34/μm.

According to this evaluation, the rate of change in y of the variable-composition layer in the portion including the pn junction was 0.22 to 0.34/μm. Thus, the rate of change in y varies depending rating because the rate of change in y depends on the measurement position.

Example 2

<Production of Substrate>

In the same method as in Example 1, a substrate including an n-type semiconductor base made of the clathrate compound ($Ba_8Au_4Si_{42}$) and a deposition film (thickness of about 1 μm) of gold as a coating layer on one principal surface of the n-type semiconductor base was obtained.

<Production of Semiconductor Substrate Having pn Junction>

The substrate produced as described above was loaded into a tubular electric furnace, and heating was performed in an argon gas atmosphere. As the heating condition, the temperature was raised up to 800° C. at a temperature rising rate of about 30° C./min and held for 5 minutes at 800° C. After that, natural cooling was performed down to the room temperature in a rate of about 3° C./min. A semiconductor substrate having a pn junction was produced in this manner. Although there was metallic luster due to a deposition film of gold on the principal surface of the substrate before the heating, the metallic luster disappeared after the heating. This denotes that the gold is diffused into the semiconductor substrate.

<Evaluation of Semiconductor Substrate 1>

Figure 13:
FIG. 13 is a photograph showing an EPMA image of the cut plane along the thickness direction in the vicinity of a principal surface of a semiconductor substrate of Example 2.

The produced semiconductor substrate was cut along the thickness direction. Then, the cut plane was evaluated in the same manner as in Example 1. FIG. 13 is a photograph showing an EPMA image of the cut plane along the thickness direction in the vicinity of the principal surface of the semiconductor substrate. As shown in FIG. 13, in the principal surface side of the semiconductor substrate, the variable-composition layer 30 of which contrast was different from the inner side due to the diffusion of gold was foamed. The thickness of the variable-composition layer 30 was about 12 μm in average. In addition, the variable-composition layer 30 had the surface layer 42 on the surface side. The surface layer 42 contained the gold alone and the clathrate compound.

Figure 14:
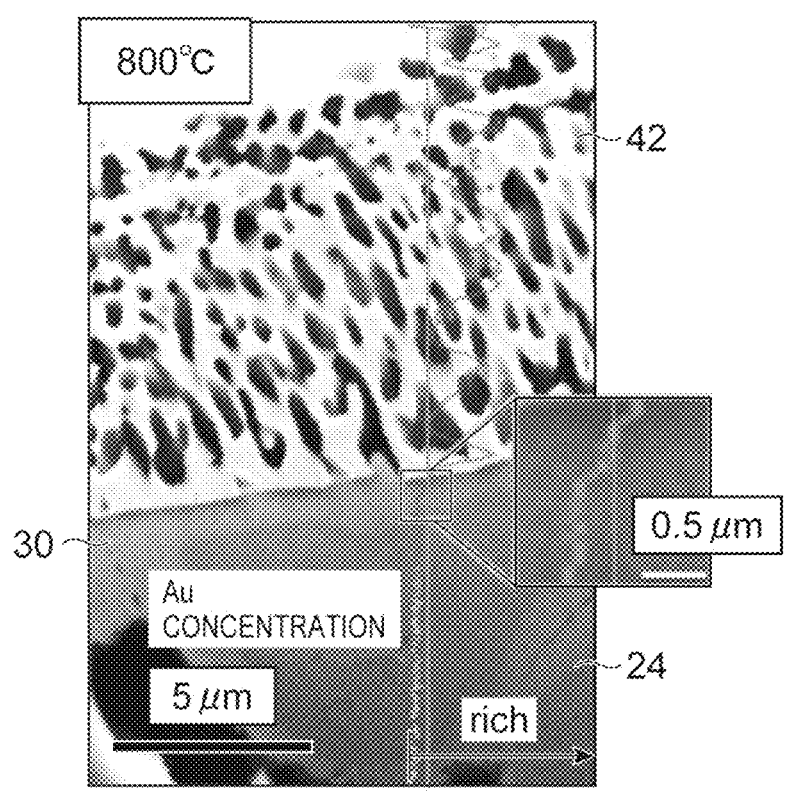
FIG. 14 is a photograph showing an image and analysis results of an SEM-EDX composition analysis performed after further expanding the cut plane shown in FIG. 13.

FIG. 14 is a photograph showing an image and analysis results of the SEM-EDX composition analysis performed after further expanding the cut plane shown in FIG. 13. The line longitudinally traversing the vicinity of the center in this photograph is a result of a line analysis of gold (Au) concentration, and it represents that, as the line is more deflected on the right side of FIG. 14, the gold concentration becomes higher. It was confirmed from this result that the variable-composition layer 30 where the composition varied along the thickness direction was formed due to the diffusion of gold into the substrate side. In addition, it was confirmed that, in the lower side of the variable-composition layer 30, there was the base layer 24 where the composition does not vary along the thickness direction of the clathrate compound.

Figure 15:
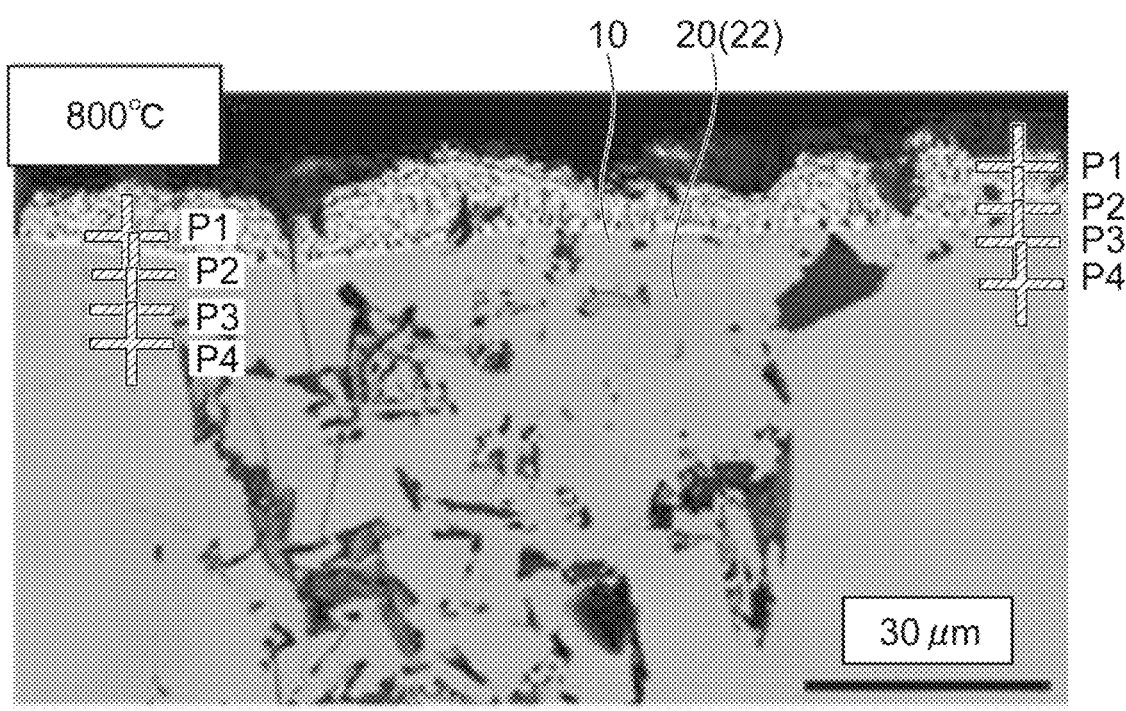
FIG. 15 is a photograph of an EPMA image of the same cut plane as those of FIGS. 13 and 14.

FIG. 15 is a photograph of an EPMA image of the same cut plane as those of FIGS. 13 and 14. Then, in FIG. 15, point analysis was performed for the positions of P2 to P4 added with the cross marks by using EPMA-WDX in the same manner as in Example 1. The point analysis was performed for a total of eight points at each of the points of P1, P2, P3, and P4 as shown in FIG. 15. The points located in equivalent depth from the surface of the semiconductor substrate were denoted by the same reference numerals of P1 to P4, and the arithmetic mean value at each of P1 to P4, in the elemental analysis was calculated. The arithmetic mean values obtained for P1 to P4 were converted in terms of the composition ratio of the clathrate compound of General Formula (II) and were listed in Table 7. Each item in Table 7 is defined to be the same as each item in Table 2.

TABLE 7

| Position | Ba (x) | Au (y) | Si (46 − y) | Au/Ba (y/x) | Distance (μm) | Rate of change in y (μm$^{-1}$) | L (μm) | Type of semiconductor |
|---|---|---|---|---|---|---|---|---|
| P1 | 3.53 | 11.60 | 34.40 | 3.29 | 0 (Reference value) | — | — | p-type semiconductor portion |

TABLE 7-continued

| Position | Ba (x) | Au (y) | Si (46 − y) | Au/Ba (y/x) | Distance (μm) | Rate of change in y (μm$^{-1}$) | L (μm) | Type of semiconductor |
|---|---|---|---|---|---|---|---|---|
| P2 | 7.78 | 5.78 | 40.22 | 0.74 | 7.0 | 0.15 | 6.8 | p-type semiconductor portion |
| P3 | 7.70 | 4.87 | 41.13 | 0.63 | 13.2 | — | — | n-type semiconductor portion |
| P4 | 7.74 | 4.85 | 41.15 | 0.63 | 19.8 | — | — | n-type semiconductor portion |

Since P1 of Table 7 was located in the surface layer, P1 was higher in gold concentration than P2 to P4. This is because the surface layer contains the gold alone and the clathrate compound. For P1, since the analysis result is converted in terms of the composition ratio of the clathrate compound of General Formula (II) as it is, y exceeds 6, and x is less than 7.

The compositions of the regions of P1 to P4 were changed along the thickness direction of the semiconductor substrate. In addition, it was confirmed that there was a pn junction between P2 and P3. The "Rate of change in y" between P2 and P3 was 0.15/μm.

<Evaluation of Semiconductor Substrate 2>

Figure 16:
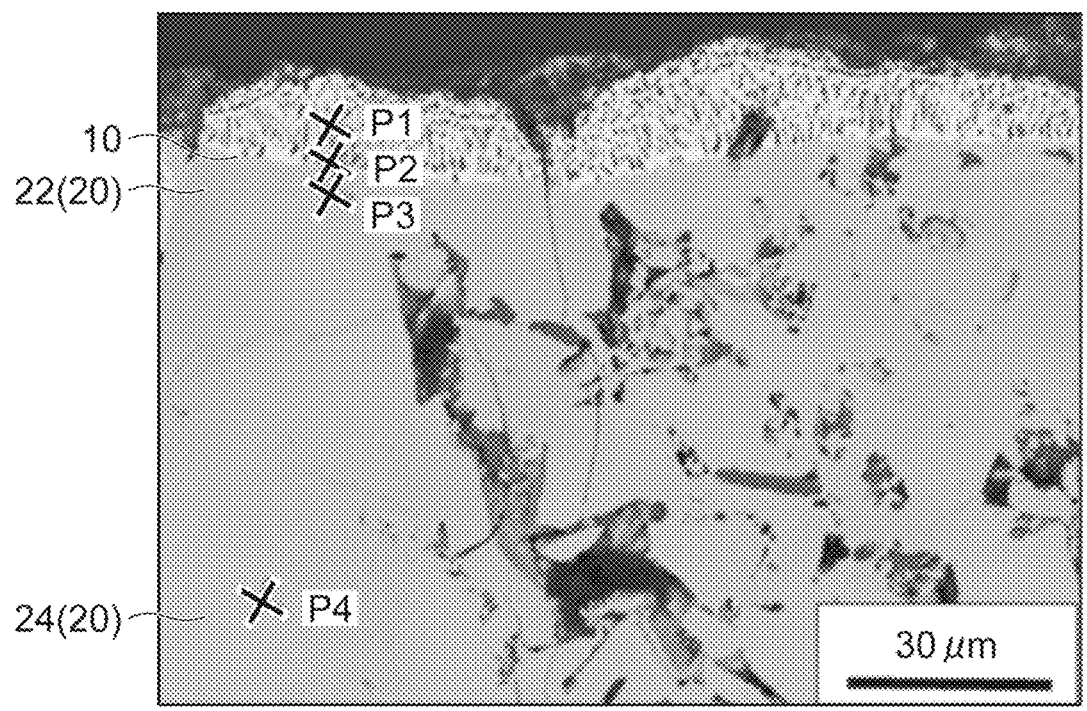
FIG. 16 is a photograph of an EPMA image of the same cut plane as that of FIG. 15.

The point analysis was performed for different positions in the same cut plane as the cut plane evaluated in the "Evaluation of Semiconductor Substrate 1" described above. FIG. 16 is a photograph of an EPMA image of the same cut plane as that of FIG. 15. Then, in FIG. 16, point analysis was performed for the positions of P1 to P4 added with the cross marks by using EPMA-WDX in the same manner as in "Evaluation of Semiconductor Substrate 1". The point analysis was performed for a total of four points at each of the points of P1 to P4 as shown in FIG. 16. The measurement values were converted in terms of the composition ratios of the clathrate compound of General Formula (II) and were listed in Table 8. Each item in Table 8 is defined to be the same as each item in Table 2.

Figure 17:
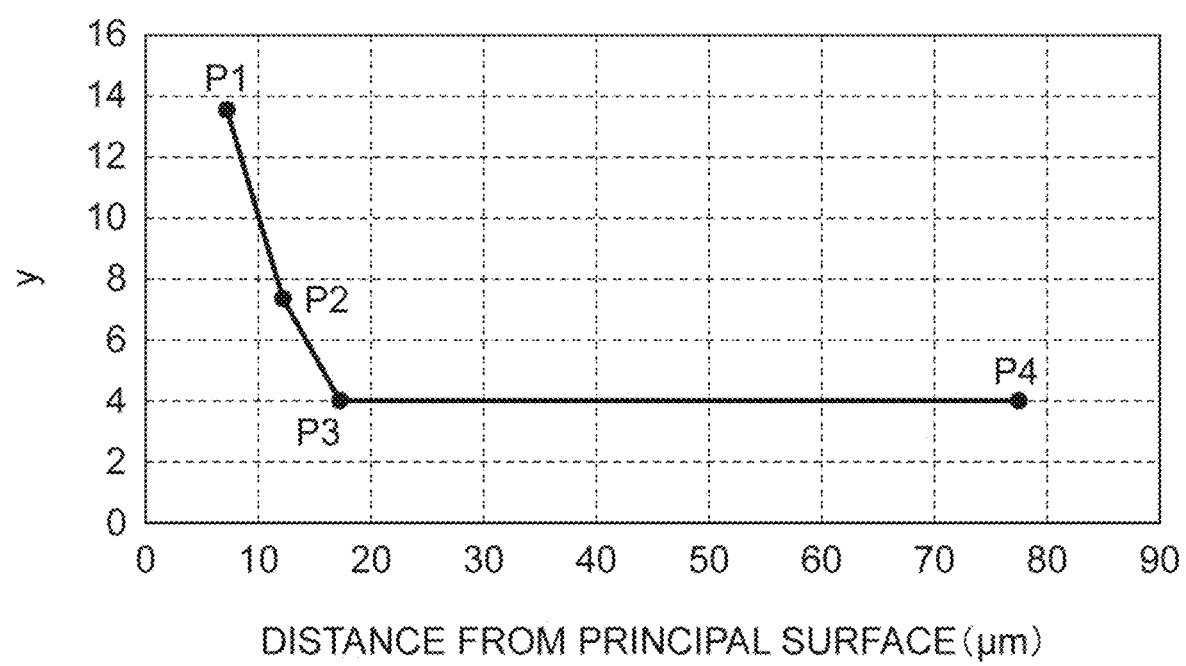
FIG. 17 is a graph showing a relationship between a distance from the principal surface where a surface layer exists and y obtained by conversion in terms of the composition ratio of General Formula (II) in the cut plane of the semiconductor substrate shown in FIG. 16.

FIG. 17 is a graph showing a relationship between a distance from the principal surface where the surface layer exists and y obtained by conversion in terms of the composition ratio of General Formula (II) in the cut plane of the semiconductor substrate. As shown in FIG. 17, P1 and P2 are located in the surface layer containing the clathrate compound and the gold alone. For this reason, y of P1 and P2 exceeds 6, and x of P1 is less than 7. For P3 and P4, the composition equivalent to that of the clathrate compound used as a starting material of the substrate was obtained.

TABLE 8

| Position | Ba (x) | Au (y) | Si (46 − y) | Au/Ba (y/x) | Distance (μm) | Rate of change in y (μm$^{-1}$) | L (μm) | Type of semiconductor |
|---|---|---|---|---|---|---|---|---|
| P1 | 5.71 | 13.64 | 32.36 | 2.39 | 0 (Reference value) | — | — | p-type semiconductor portion |
| P2 | 7.71 | 7.47 | 38.52 | 0.97 | 5.7 | 0.85 | 1.2 | p-type semiconductor portion |
| P3 | 8.78 | 4.16 | 41.84 | 0.47 | 9.6 | — | — | n-type semiconductor portion |
| P4 | 8.12 | 4.03 | 41.97 | 0.50 | 70.8 | — | — | n-type semiconductor portion |

It was found from the results shown in FIG. 17 and Table 8 that the concentration of gold sharply varied between P1 and P3, and thus, there was a pn junction between P2 and P3. In addition, it was confirmed that, when the heating temperature was 800° C., the diffusion length of the gold was approximately 20 μm. Therefore, P3 of FIG. 16 belongs to the diffusion layer 22, and P4 belongs to the base layer 24.

[Relationship Between Heating Temperature and Outer Appearance of Substrate]

Figure 18:
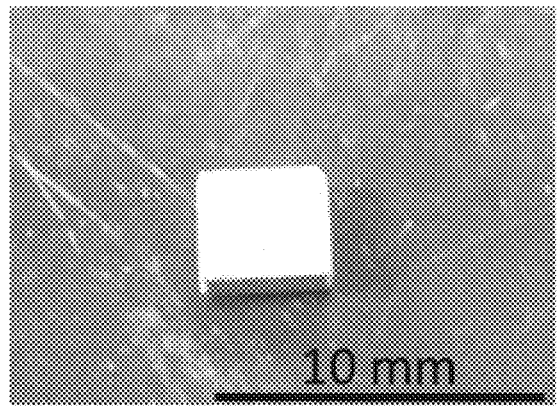
FIG. 18 is a photograph of a substrate and a semiconductor substrate.
Figure 18:
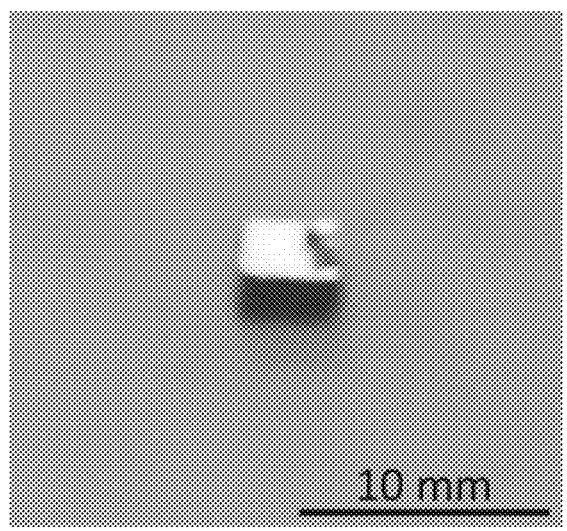
Figure 18:
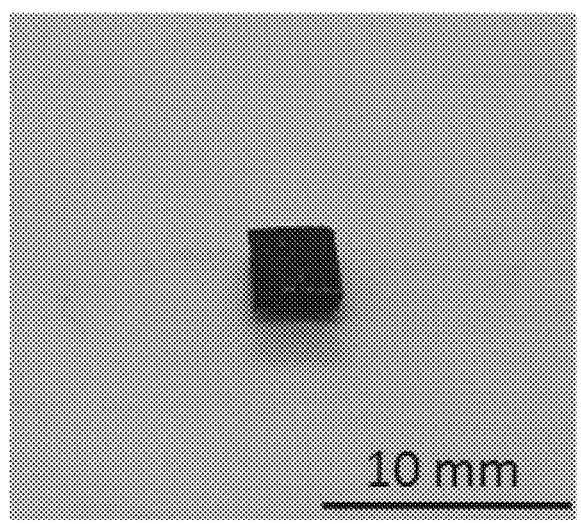

FIG. 18(A) is a photograph of a substrate used in Example 1. The substrate had metallic luster due to a deposition film of gold on the surface thereof. FIG. 18(B) is a photograph of the substrate obtained by heating the substrate produced in the same procedure as that in Example 1 to 300° C. As the heating conditions, in an argon gas atmosphere, the temperature was raised up to 300° C. at a temperature rising rate of about 5° C./min and held for 1 minute at 300° C., and after that, natural cooling was performed down to a room temperature at a rate of about 3° C./min. A metallic luster remained on the surface of the substrate.

FIG. 18(C) is a photograph of the semiconductor substrate obtained with the same heating conditions as in the case of FIG. 18(B) except that the heating temperature is changed from 300° C. to 400° C. The semiconductor substrate had no metallic luster on the surface thereof. Therefore, it was confirmed that, when the substrate was heated to 400° C., gold was diffused into the interior of the substrate (n-type semiconductor base).

FIG. 19(A) is a photograph of the semiconductor substrate obtained with the same heating conditions as in the case of FIG. 18(B) except that the heating temperature is changed from 300° C. to 500° C. The semiconductor substrate also had no metallic luster on the surface thereof.

Figure 19:
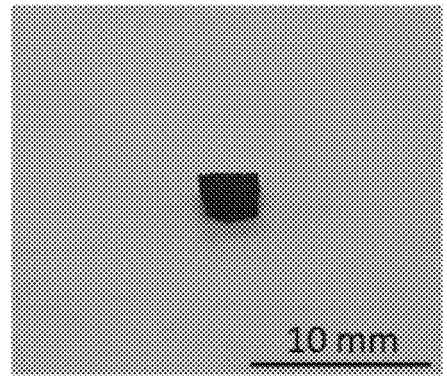
FIG. 19 is a photograph of a semiconductor substrate.
Figure 19:
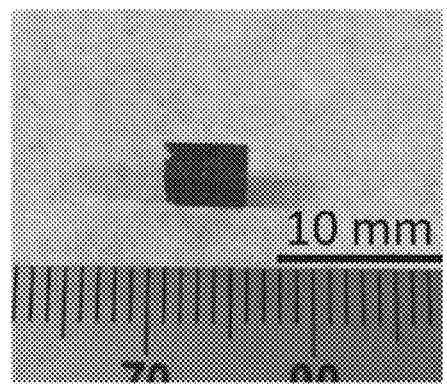
Figure 19:
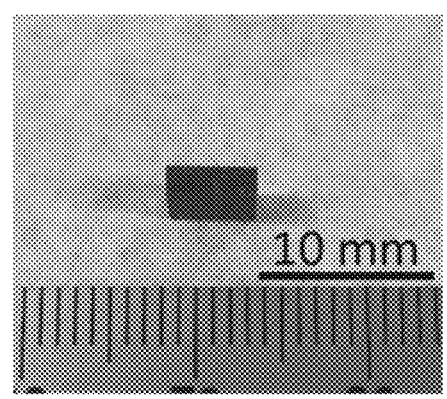

FIG. 19(3) is a photograph of the semiconductor substrate obtained with the same heating conditions as in Example 1 except that the heating temperature is changed from 900° C. to 600° C. The semiconductor substrate also had no metallic luster on the surface thereof. FIG. 19(C) is a photograph of the semiconductor substrate obtained with the same heating conditions as in Example 1 except that the heating temperature is changed from 900° C. to 700° C. The semiconductor substrate also had no metallic luster on the surface thereof.

Figure 20:
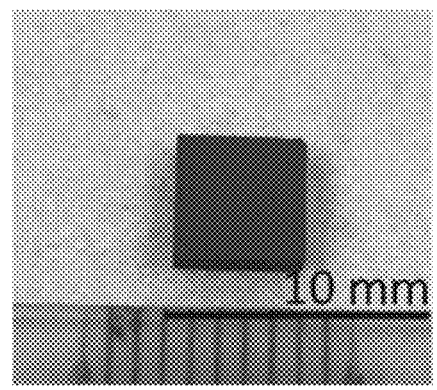
FIG. 20 is a photograph of a semiconductor substrate.
Figure 20:
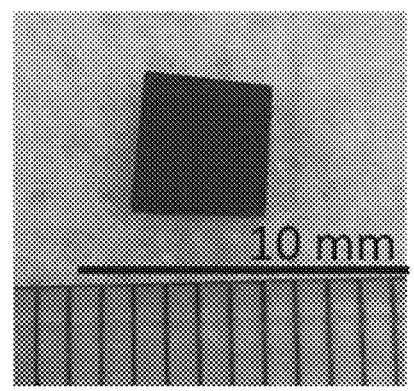
Figure 20:
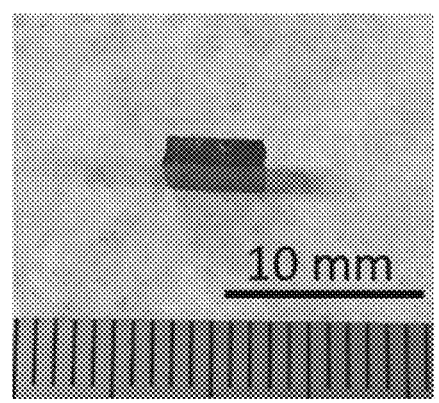

FIG. 20(A) is a photograph of a semiconductor substrate produced in Example 2. FIG. 20(B) is a photograph of a semiconductor substrate produced in Example 1. FIG. 20(C) is a photograph of the semiconductor substrate obtained with the same heating conditions as in Example 1 except that the heating temperature is changed from 900° C. to 950° C. All the semiconductor substrates of FIGS. 20(A), 20(B), and 20(C) had no metallic luster on the surface. It was confirmed from these results that, when the substrate was heated to 400 to 950° C., gold was diffused into the interior of the substrate (n-type semiconductor base).

[Measurement of Electromotive Force]

Figure 21:
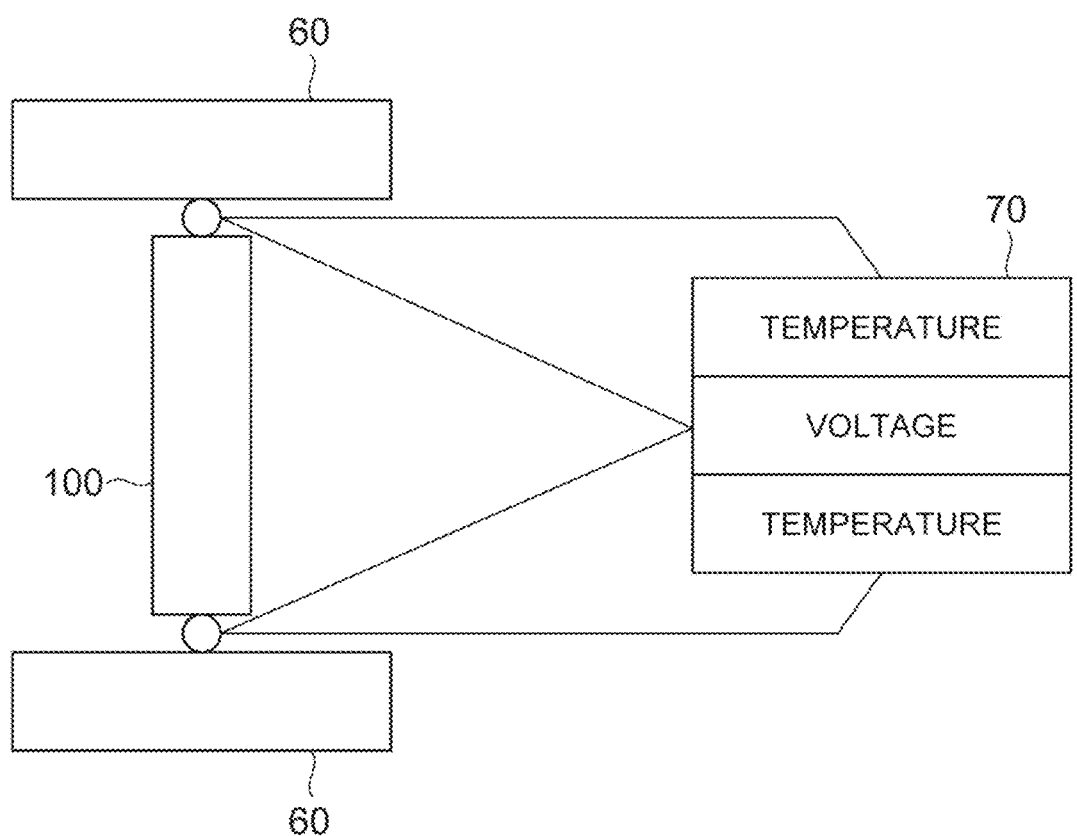
FIG. 21 is a diagram illustrating an outline of an apparatus for measuring an electromotive force.

The electromotive forces of the semiconductor substrates of Examples 1 and 2 were evaluated by the following procedure. A measuring apparatus illustrated in FIG. 21 was prepared. Both ends (that is, a p-type semiconductor portion and an n-type semiconductor portion) in the thickness direction of the semiconductor substrates of Examples 1 and 2 were connected to respective wires. Of both ends of the semiconductor substrate, the one end (p-type semiconductor portion) where the deposition film of gold was deposited was connected to +side, and the end (n-type semiconductor portion) of the opposite side was connected to −side. Then, the semiconductor substrate was heated by a pair of heaters 60 arranged so as to interpose the semiconductor substrate in the thickness direction, and the potential difference between both ends in the thickness direction of the semiconductor substrate was measured. During the heating, while allowing the temperature difference not to occur between the both ends of the semiconductor substrate 100 by adjusting the output of the pair of heaters 60, the potential difference was measured. The electromotive force and the temperature of both ends were recorded by a recording unit 70.

Figure 22:
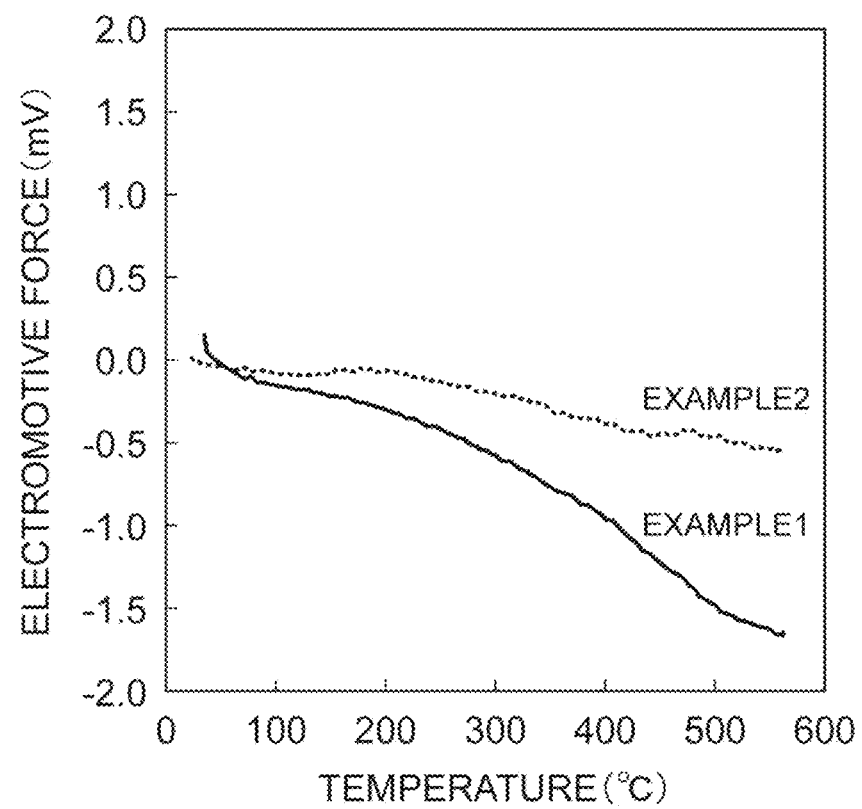
FIG. 22 is a graph showing measurement results of the electromotive force of the semiconductor substrates obtained in Examples 1 and 2.

FIG. 22 is a graph showing the measurement results of the respective electromotive forces of the semiconductor substrates produced in Examples 1 and 2. As shown in FIG. 22, in both Examples 1 and 2, it was confirmed that, even if there is no temperature difference between both ends of the semiconductor substrate, the potential difference occurs by heating to a predetermined temperature or more. In terms of the absolute values, Example 1 obtained a larger electromotive force than Example 2.

Thus, it is considered that the potential difference is increased by increase in temperature because the increase in heat energy causes electrons and holes excited at the pn junction having smaller band gap to be increased. That is, in the semiconductor substrate, in a predetermined temperature range, electrons are excited from the valence band to the conduction band only in an intrinsic semiconductor portion of the pn junction, and the electrons moved to the conduction band are moved to the n-type semiconductor portion side having lower energy. On the other hand, the holes generated in the valence band at the pn junction are moved to the p-type semiconductor portion side. Due to the deviation of the carriers, the semiconductor substrates of Examples 1 and 2 become power generation material using a p-type semiconductor portion as a positive electrode and an n-type semiconductor portion as a negative electrode.

Figure 23:
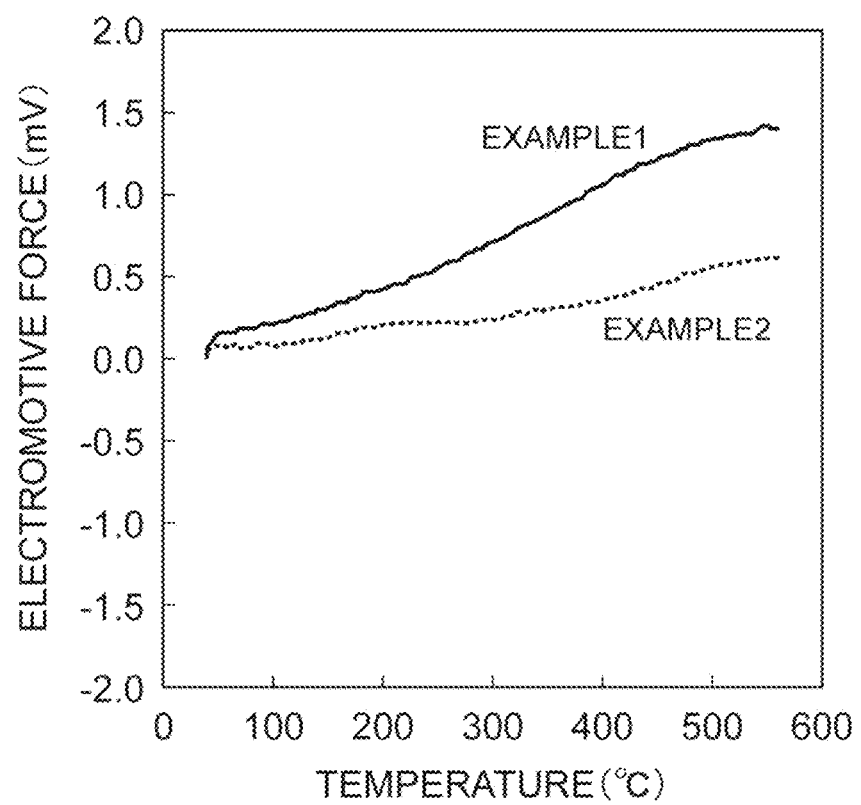
FIG. 23 is a graph showing measurement results of the electromotive force of the semiconductor substrates obtained in Examples 1 and 2.

Next, reversion was made so that the orientations of the thickness directions of the semiconductor substrates of Examples 1 and 2 were reversed, and a reverse electromotive force was measured in the same manner. The results are shown in FIG. 23. As shown in FIG. 23, the results similar to the results shown in FIG. 22 were obtained except that the positive and the negative were reversed. It was confirmed from these results that the semiconductor substrates of Examples 1 and 2 generate a potential difference by heating even if there is no temperature difference between the both ends.

Comparative Example 1

Figure 24:
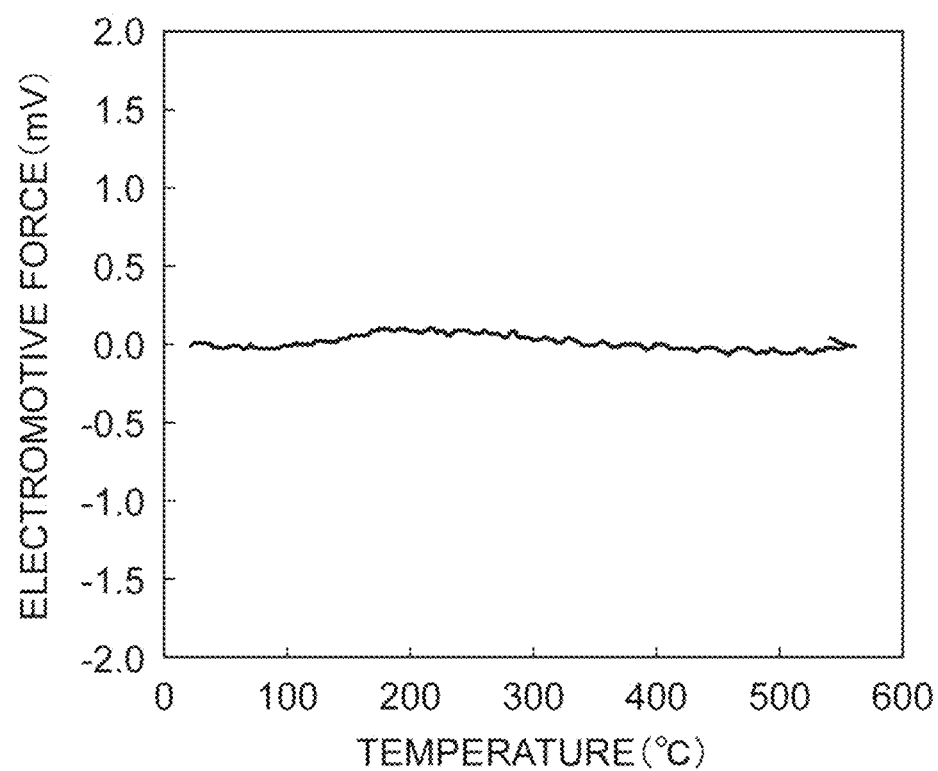
FIG. 24 is a graph showing measurement results of the electromotive force of a substrate of Comparative Example 1.

The electromotive force of the substrate used in Example 1 was evaluated. Specifically, before the formation of a deposition film of gold, a substrate made of an n-type semiconductor was set to the measuring apparatus illustrated in FIG. 21, and an electromotive force was measured in the same manner as the semiconductor substrates of Examples 1 and 2. The results are shown in FIG. 24. As shown in FIG. 24, the electromotive force was hardly obtained. In addition, although a slight electromotive force is generated, the electromotive force is caused by the occurrence of the temperature difference of about 0.5° C. between the both ends of the substrate.

[Production and Composition Evaluation of Semiconductor Single Crystal]

Comparative Example 2

Figure 25:
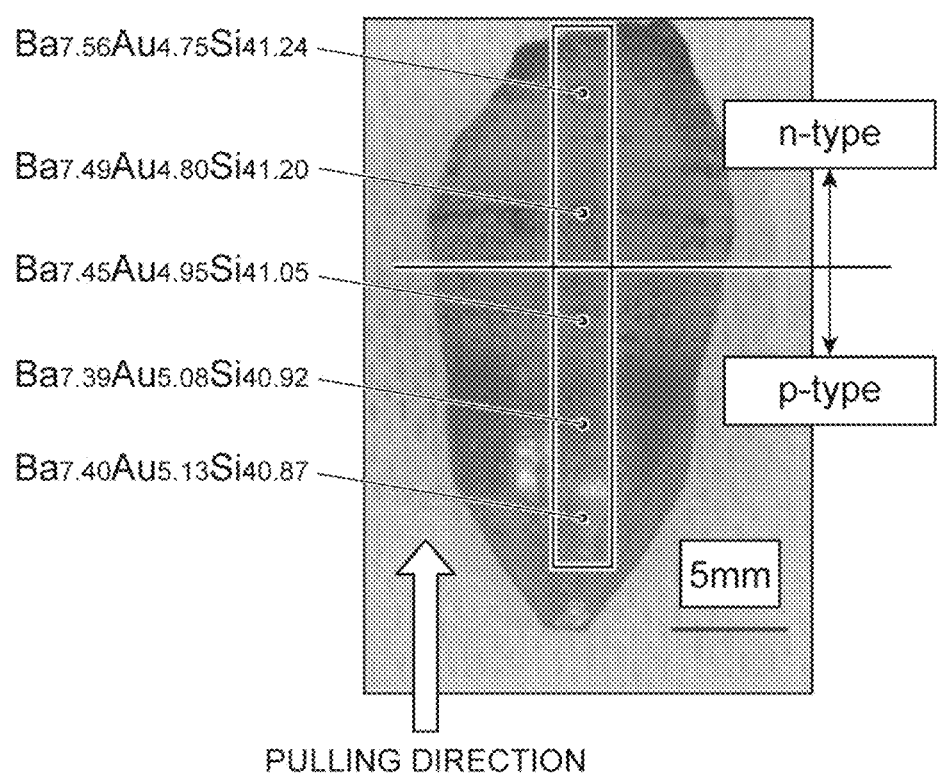
FIG. 25 is a view illustrating an optical microscope photograph and composition of a semiconductor single crystal obtained in Comparative Example 2.

Commercial Ba powder, Au powder, and Si powder (all having high purity) were prepared. These powders were weighed so that Ba:Au:Si=8:8:38 (molar ratio). Each powder weighed was put into Cu mold, and the mold was placed in the chamber. After replacing the interior of the chamber with argon gas, heating was performed at about 2000° C. by an arc melting method to melt the powder in the Cu mold. After one hour elapsed from the melt, a shaft with Si at the tip as a seed crystal was brought into contact with a liquid surface of a melted liquid while rotating at 30 rpm. Then, while cooling the clathrate compound to 1079° C., the shaft was pulled upward at a rate of 5 mm/hour. By such a Czochralski method, a single crystal of the clathrate compound having a bell shape as illustrated in FIG. 25 was produced. The upward direction in FIG. 25 is the pulling direction in the Czochralski method.

The single crystal was cut to approximately the same size along the direction from the top of the single crystal downward, and an elemental analysis was performed by using an electron probe microanalyzer (EPMA-1200 (WDX)). At this time, the filament voltage was set to 15 kV, and the filament current was set to 10 nA. The measurement values of the elemental analysis were converted in terms of the composition ratios of the clathrate compound of General Formula (II). The converted composition ratios were as illustrated in FIG. 25.

The length along the longitudinal direction of the obtained single crystal was about 24 mm. As it is clear from the composition ratio illustrated in FIG. 25, the value of y was gradually increased downward from the top of FIG. 25. Throughout the single crystal, the rate of change in y in the longitudinal direction did not vary significantly. The rate of change in y of the portion including the pn junction was $(4.95-4.80)/5 \text{ mm} = 0.03/\text{mm} = 3 \times 10^{-5}/\mu\text{m}$.

INDUSTRIAL APPLICABILITY

According to the present disclosure, in one aspect, it is possible to provide a semiconductor substrate capable of efficiently generating power even when the semiconductor substrate is thinned. In addition, in another aspect, it is possible to provide a producing method capable of easily producing a semiconductor substrate useful as a power generation material. Furthermore, in another aspect, it is possible to provide a substrate useful for producing the above-described semiconductor substrate and a laminate obtained by laminating the above-described semiconductor substrate.

REFERENCE SIGNS LIST

10: p-type semiconductor portion, 15: pn junction, 20: n-type semiconductor portion, 22: diffusion layer, 24: base layer, 30: variable-composition layer, 40: coating layer, 42: surface layer, 50: electrode, 60: heater, 70: recording unit, 100, 130: semiconductor substrate, 100*a*, 100*b*, 130*a*, 130*b*: principal surface, 110: substrate, 150: laminated portion, 200: laminate.

The invention claimed is:

1. A semiconductor substrate containing a clathrate compound of the following General Formula (I), comprising:
   a variable-composition layer where composition varies along a thickness direction and which includes a pn junction,
   wherein, when the composition is converted in terms of a composition ratio of the clathrate compound, a rate of change in y in the thickness direction of a portion of the variable-composition layer including the pn junction is $1\times10^{-4}$/μm or more, $$A_xB_yC_{46-y} \qquad (I)$$

wherein in the General Formula (I), A represents at least one element selected from the group consisting of Ba, Na, Sr, and K, B represents at least one element selected from the group consisting of Au, Ag, Cu, Ni, and Al, and C represents at least one element selected from the group consisting of Si, Ge, and Sn, x is 7 to 9, and y is 3.5 to 6 or 11 to 17.

2. The semiconductor substrate according to claim 1, further comprising
   an n-type semiconductor portion and a p-type semiconductor portion which is larger in y/x than the n-type semiconductor portion so as to interpose the pn junction, wherein
   a thickness of the semiconductor substrate is 5 mm or less.

3. The semiconductor substrate according to claim 1, wherein
   a maximum value of a difference between y in the p-type semiconductor portion and y in the n-type semiconductor portion is 1 or more and not greater than 9.61.

4. The semiconductor substrate according to claim 1, wherein
   the clathrate compound is represented by the following General Formula (II), $$Ba_xAu_ySi_{46-y} \qquad (II)$$

wherein in the General Formula (II), x is 7 to 9, and y is 3.5 to 6.

5. A laminate comprising:
   a laminated portion where a plurality of the semiconductor substrates according to claim 1 are laminated so the semiconductor substrates are adjacent to each other in the thickness direction and so that increasing and decreasing directions of y are the same.

6. The semiconductor substrate according to claim 2, wherein
   a maximum value of a difference between y in the p-type semiconductor portion and y in the n-type semiconductor portion is 1 or more and not greater than 9.61.

7. The semiconductor substrate according to claim 2, wherein
   the clathrate compound is represented by the following General Formula (II), $$Ba_xAu_ySi_{46-y} \qquad (II)$$

wherein in the General Formula (II), x is 7 to 9, and y is 3.5 to 6.

8. The semiconductor substrate according to claim 3, wherein
   the clathrate compound is represented by the following General Formula (II), $$Ba_xAu_ySi_{46-y} \qquad (II)$$

wherein in the General Formula (II), x is 7 to 9, and y is 3.5 to 6.

9. A laminate comprising:
   a laminated portion where a plurality of the semiconductor substrates according to claim 2 are laminated so the semiconductor substrates are adjacent to each other in the thickness direction and so that increasing and decreasing directions of y are the same.

10. A laminate comprising:
    a laminated portion where a plurality of the semiconductor substrates according to claim 3 are laminated so the semiconductor substrates are adjacent to each other in the thickness direction and so that increasing and decreasing directions of y are the same.

11. A laminate comprising:
    a laminated portion where a plurality of the semiconductor substrates according to claim 4 are laminated so the semiconductor substrates are adjacent to each other in the thickness direction and so that increasing and decreasing directions of y are the same.

* * * * *